(12) United States Patent
Kaufmann et al.

(10) Patent No.: US 11,394,380 B2
(45) Date of Patent: Jul. 19, 2022

(54) GATE DRIVERS AND AUTO-ZERO COMPARATORS

(71) Applicant: Texas Instruments Incorporated, Dallas, TX (US)

(72) Inventors: Maik Peter Kaufmann, Freising (DE); Michael Lueders, Freising (DE); Cetin Kaya, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/942,390

(22) Filed: Jul. 29, 2020

(65) Prior Publication Data

US 2021/0044286 A1 Feb. 11, 2021

Related U.S. Application Data

(60) Provisional application No. 62/890,891, filed on Aug. 23, 2019, provisional application No. 62/885,026, filed on Aug. 9, 2019.

(51) Int. Cl.
*H03K 17/00* (2006.01)
*H03K 17/082* (2006.01)
*H03K 19/0185* (2006.01)

(52) U.S. Cl.
CPC . *H03K 17/0822* (2013.01); *H03K 19/018564* (2013.01)

(58) Field of Classification Search
CPC .. H03K 17/687; H03K 17/0822; H03K 17/56; H03K 17/6871; H03K 17/6872; H03K 17/6877; H03K 17/063; H03K 17/08122; H03K 2217/0027; H03K 17/08; H03K 19/018521; H03K 19/018564; G05F 1/46
USPC .......................................... 327/108, 109, 112
See application file for complete search history.

(56) References Cited

U.S. PATENT DOCUMENTS

| 6,040,736 A | * | 3/2000 | Milanesi ................. G05F 1/575 323/316 |
| 9,722,593 B2 | * | 8/2017 | Berkhout ......... H03K 17/08122 |
| 10,243,546 B2 | | 3/2019 | de Rooij et al. |

(Continued)

OTHER PUBLICATIONS

Pei, Ruihan & Liu, Jia & Tang, Xian & Li, Fule & Wang, Zhihua, "A low-offset dynamic comparator with input offset-cancellation," 132-135. 10.1109/ASICON.October 2017.8252429 (4 pages).

(Continued)

*Primary Examiner* — Hai L Nguyen
(74) *Attorney, Agent, or Firm* — Michelle F. Murray; Charles A. Brill; Frank D. Cimino

(57) ABSTRACT

Gate drivers and auto-zero comparators are disclosed. An example integrated circuit includes a transistor comprising a gate terminal and a current terminal, a gallium nitride (GaN) gate driver coupled to the gate terminal, the GaN gate driver configured to adjust operation of the transistor, and an enhancement mode GaN comparator coupled to at least one of the transistor the GaN gate driver, the enhancement mode GaN comparator configured to compare a voltage to a reference voltage, the voltage based on current from the current terminal, the GaN gate driver configured to adjust the operation of the transistor based on the comparison.

20 Claims, 15 Drawing Sheets

(56) References Cited

U.S. PATENT DOCUMENTS 10,651,846 B2 * 5/2020 Fukushima ........... H02M 3/158

OTHER PUBLICATIONS

X. Liu and K. J. Chen, "Single-Polarity Power Supply Bootstrapped Comparator for GaN Smart Power Technology," 2010 IEEE Compound Semiconductor Integrated Circuit Symposium (CSICS), Monterey, CA, Oct. 2010, pp. 1-4 (4 pages).
A. M. Abo and P. R. Gray, "A 1.5-V, 10-bit, 14.3-MS/s CMOS pipeline analog-to-digital converter," in IEEE Journal of Solid-State Circuits, vol. 34, No. 5, pp. 599-606, May 1999 (8 pages).
Gaofei Tang, et al., "High-Speed, High-Reliability GaN Power Device with Integrated Gate Driver," in Proceedings of the 30th International Symposium on Power Semiconductor Devices & ICs, pp. 76-79, May 13-17, 2018 (4 pages).
Kaufmann, et al., "A Monolithic E-Mode GaN 15W 400V Offline Self-Supplied Hysteretic Buck Converter with 95.6% Efficiency," 2020 IEEE International Solid-State Circuits Conference, pp. 6-8, Dec. 14, 2019, (3 pages).
Kaufmann, et al., "A Monolithic GaN-IC with Integrated Control Loop for 400V Offline Buck Operation Achieving 95.6% Peak Efficiency," IEEE Journal of Solid-State Circuits, pp. 1-10, Apr. 27, 2020, (10 pages).

* cited by examiner

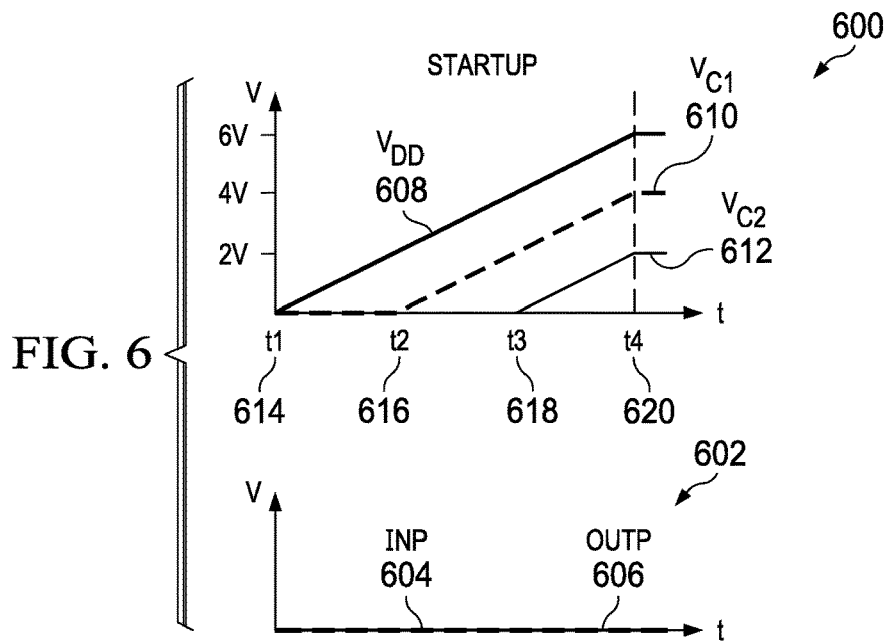
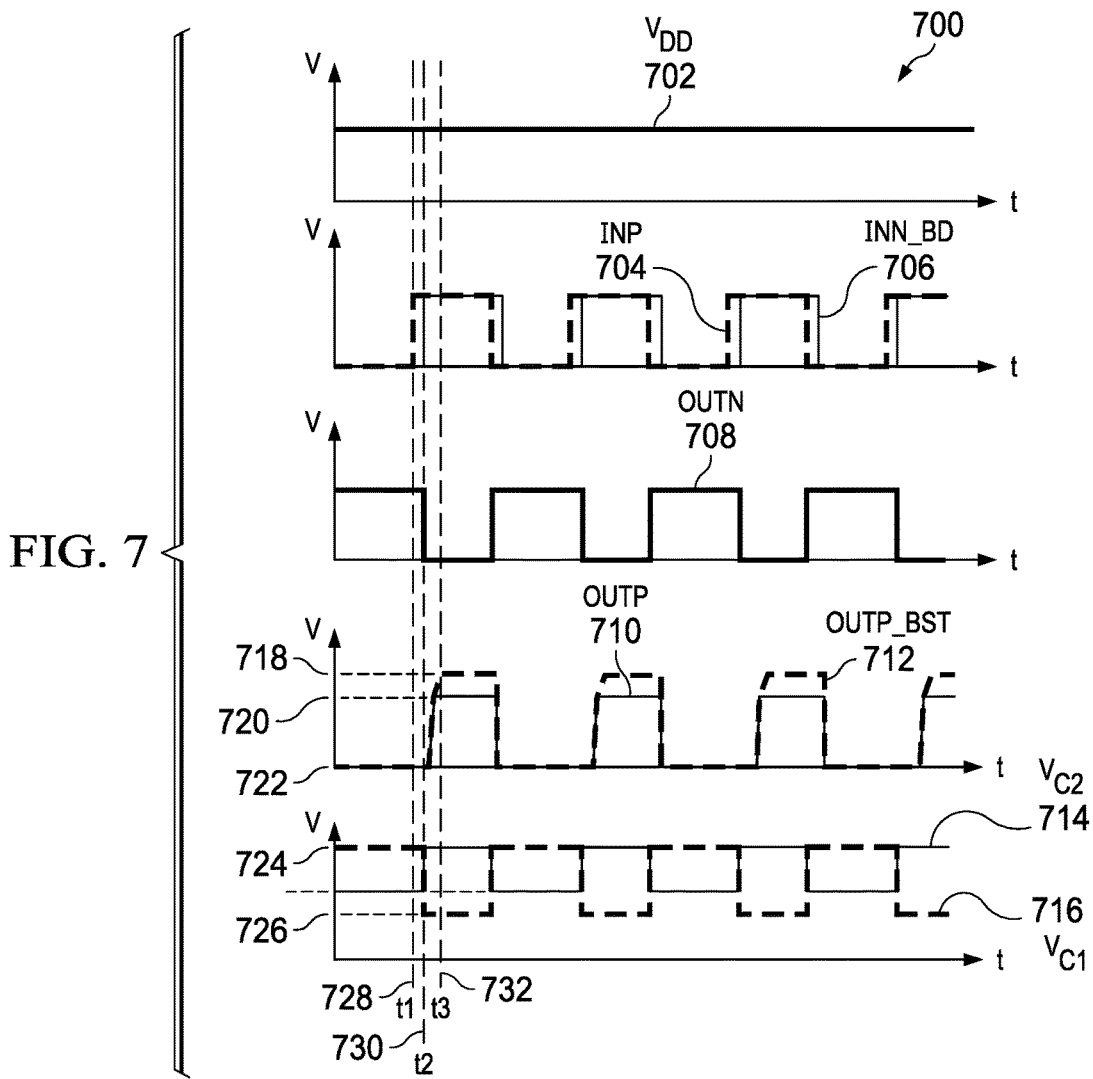

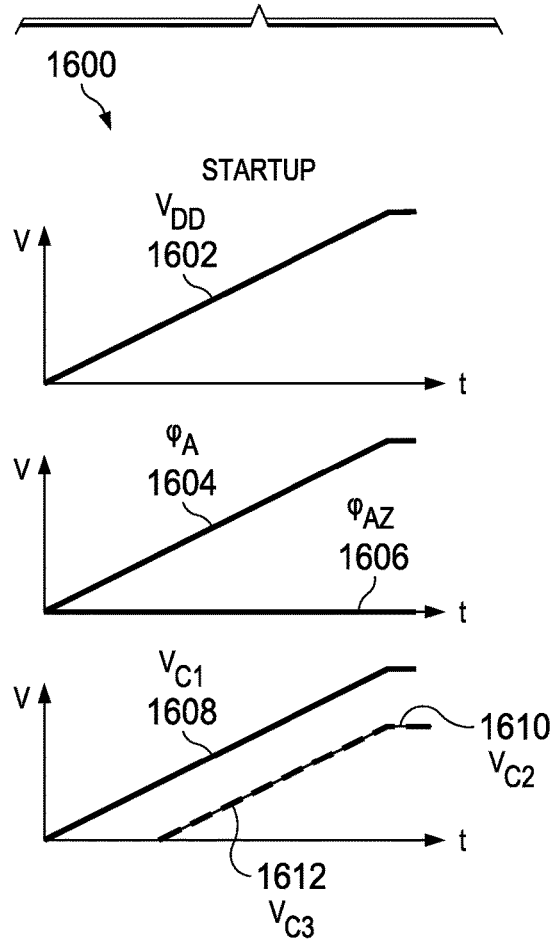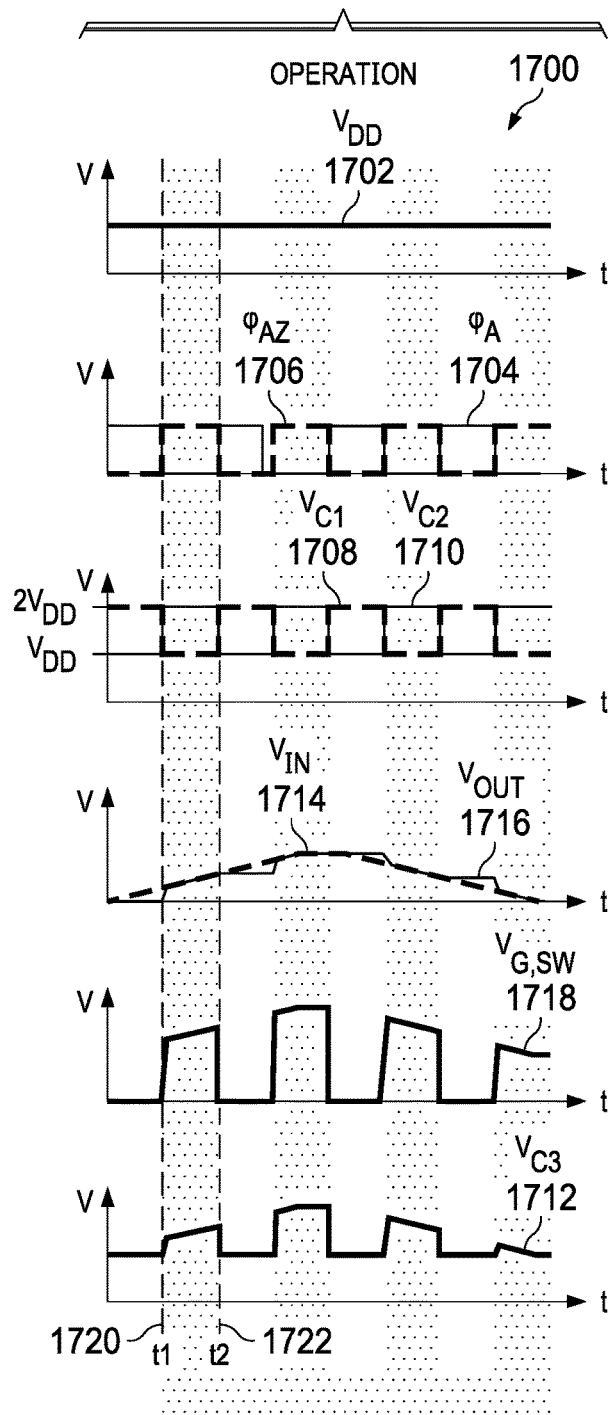

GATE DRIVERS AND AUTO-ZERO COMPARATORS

RELATED APPLICATION

This patent arises from an application claiming the benefit of U.S. Provisional Patent Application Ser. No. 62/885,026, which was filed on Aug. 9, 2019, and U.S. Provisional Patent Application Ser. No. 62/890,891, which was filed on Aug. 23, 2019, which are hereby incorporated herein by reference in their entireties.

FIELD OF THE DISCLOSURE

This disclosure relates generally to circuits and, more particularly, to gate drivers and auto-zero comparators.

BACKGROUND

High-voltage and/or high-current applications require power electronic devices capable of efficient and effective operation at various operating conditions. In such applications, power modules deliver power using power devices such as, metal-oxide-semiconductor field-effect transistors (MOSFETs), insulated-gate bipolar transistors (IGBTs), etc. A driver may be used to control a power device used as a power delivering device to support delivering power to a load.

In an Enhancement mode (E-mode) gallium nitride (GaN) process, there are limited options for Depletion mode (D-mode) devices, for example P-type devices, that can be deployed for limiting an achievable single stage gain. In some instances, the lack of P-type devices may limit an input common mode range of a comparator. In such instances, absolute parameters of GaN transistors (e.g., $V_{GS,TH}$, gm, etc.) may show relatively large variation. Such variation can lead to relatively large mismatch between GaN transistors, which can result in relatively large offset voltages of comparator circuits.

BRIEF DESCRIPTION OF THE DRAWINGS

FIG. 6 depicts a graph of example waveforms associated with the pre-driver of FIGS. 2, 4, and/or 5.

FIG. 7 is an example timing diagram associated with the pre-driver of FIGS. 2, 4, and/or 5.

FIG. 16 depicts graphs including example waveforms associated with the bootstrapped switch circuit of FIGS. 12 and/or 15.

FIG. 17 is an example timing diagram associated with the bootstrapped switch circuit of FIGS. 12 and/or 15.

DETAILED DESCRIPTION

Figure 1:
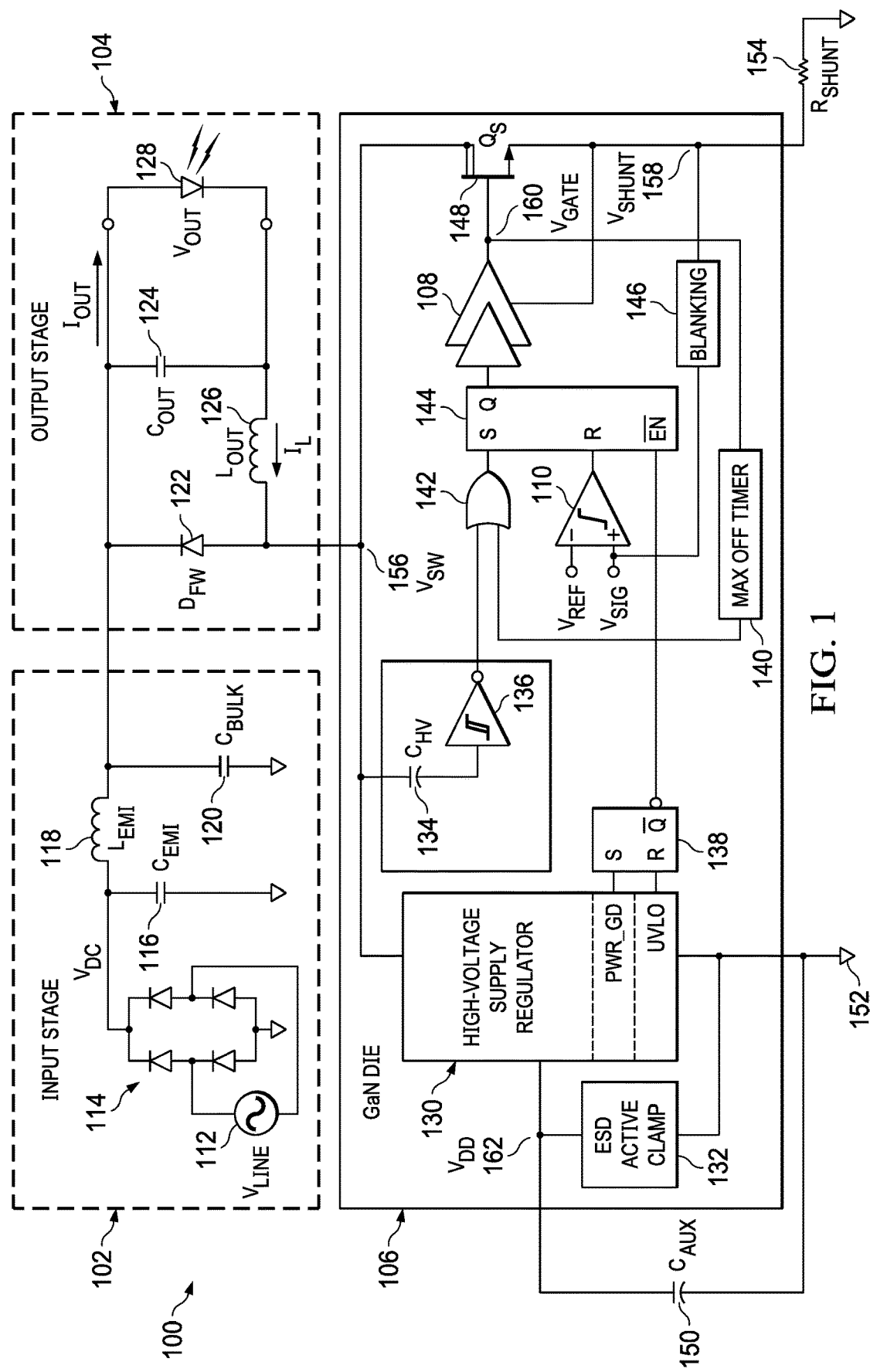
FIG. 1 is a schematic illustration of an example power delivery system including a gate driver and a comparator.

The figures are not to scale. In general, the same reference numbers will be used throughout the drawing(s) and accompanying written description to refer to the same or like parts. As used herein, connection references (e.g., attached, coupled, connected, and joined) are to be construed in light of the specification and, when pertinent, the surrounding claim language. Construction of connection references in the present application shall be consistent with the claim language and the context of the specification, which describes the purpose for which various elements are connected or coupled. As such, connection references do not necessarily infer that two elements are directly connected or directly coupled and in fixed relation to each other.

Various forms of the term "couple" are used throughout the specification. These terms may cover connections, communications, or signal paths that enable a functional relationship consistent with the description of the present disclosure. For example, if device A generates a signal to control device B to perform an action, in a first example device, A is coupled to device B by direct connection, or in a second example device, A is coupled to device B through intervening component C if intervening component C does not alter the functional relationship between device A and device B such that device B is controlled by device A via the control signal generated by device A.

Consistent with the present disclosure, the term "configured to" purports to describe the structural and functional characteristics of one or more tangible non-transitory components. For example, a device that is "configured to" perform a function can be understood to mean that the device has a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

Moreover, the term "example" is used herein to mean serving as an instance, illustration, etc., and not necessarily as advantageous. Also, although the disclosure has been shown and described with respect to one or more implementations, equivalent alterations and modifications will be apparent upon a reading and understanding of this specification and the annexed drawings. All such modifications and alterations are fully supported by the disclosure and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in an example particular order, this should not be understood as requiring that such operations be performed in the example particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

Descriptors "first," "second," "third," etc., are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

For improved switching performance, a gate driver of a power converter circuit is preferred to be placed as close as possible to a power switch (e.g., a power switch transistor) to minimize and/or otherwise reduce the parasitic gate-loop inductance. Enhancement mode (E-mode) gallium nitride (GaN) transistors (e.g., enhancement mode GaN transistors) can be such switches or power switches. In some instances, a GaN switch can be manufactured using a lateral power process, which offers monolithic integration of driver and power transistor on one die. Such monolithic integration may also provide a close placement between the gate driver and the GaN switch.

However, the monolithic integration process may lack P-type devices for use in an E-mode GaN implementation. The lack of P-type devices generates difficulty when implementing a rail-to-rail (e.g., from a ground rail (GND) or ground terminal to a supply voltage rail ($V_{DD}$) or supply voltage terminal) gate driver with transistor pull-up for efficient switching and safe turn-off of the GaN switch. In some instances, additional difficulty arises when implementing the rail-to-rail gate driver without an auxiliary voltage rail or terminal that is greater than $V_{DD}$.

In some instances, a comparator is associated with a gate driver, such as a rail-to-rail gate driver. For example, a comparator can be used as a peak current comparator in a control loop of a direct current (DC) to DC converter, as a zero comparator in an active diode, as a voltage comparator in an undervoltage lockout (UVLO) circuit, an over-voltage protection (OVP) circuit, etc. However, in E-mode GaN implementations or processes, efficient D-mode devices or P-type devices are not as prevalent. Thereby, the achievable single stage gain is limited. In some instances, the lack of efficient P-type devices may limit the input common mode range that can be supported by the comparator. In some instances, absolute parameters of GaN transistors (e.g., threshold voltage $V_{GS,TH}$, trans conductance gm, etc.) may show relatively large variation. Such variation can lead to relatively large mismatch between GaN transistors, which can result in relatively large offset voltages of comparator circuits.

Examples described herein include gate driver circuits, comparators (e.g., auto-zero comparators), and related methods. In some described gate driver circuits, an enable signal is generated with a self-timed bootstrap circuit that can generate a voltage greater than $V_{DD}$ to pull the gate of an E-mode GaN transistor up to $V_{DD}$. In some described gate driver circuits, the pull-up path and pull-down path associated with the E-mode GaN transistor can be controlled (e.g., turned on, turned off, etc.) to minimize and/or otherwise reduce DC cross current to provide driving levels of 0 Volts (V) and $V_{DD}$ to effectuate safe and reliable control of the E-mode GaN transistor. Advantageously, example gate driver circuits described herein can control a power transistor, such as an E-mode GaN transistor, without an additional voltage rail or terminal.

Examples described herein include a general auto-zero loop, which can be implemented around a differential input stage of a comparator to reduce the input referred offset of the comparator. In some described examples, the comparator and/or associated auto-zero loop can be implemented with GaN process using discrete components, such as capacitors, resistors, and E-mode N-type devices. Advantageously, in some described examples, the comparator and/or associated auto-zero loop can support rail-to-rail input common mode and can reduce offset caused by immature matching of E-mode N-type GaN devices (e.g., N-type enhancement mode GaN transistors).

FIG. 1 is a schematic illustration of an example power delivery system 100 including an example input stage 102, an example output stage 104, and an example GaN die 106. The output stage 104 may also be known as a load stage. The power delivery system 100 is an offline buck converter in a low-side configuration. The input stage 102 and the output stage 104 can be a first voltage domain (e.g., 300 V domain, 400 V domain, etc.) and the GaN die 106 can be a second voltage domain (e.g., a 5 V domain, a 6 V domain, etc.). In the example of FIG. 1, the input stage 102 is coupled to the output stage 104, and the output stage 104 is coupled to the GaN die 106. The GaN die 106 of the example of FIG. 1 includes an example gate driver 108 and an example comparator 110.

In the illustrated example of FIG. 1, the input stage 102 and the output stage 104 are in and/or otherwise form a first integrated circuit and the GaN die 106 is a second integrated circuit. Alternatively, one or more of the input stage 102, the output stage 104, and/or the GaN die 106 can be included in the same integrated circuit. In the example of FIG. 1, the input stage 102 and the output stage 104 are a first die and the GaN die 106 is a second die. Alternatively, one or more of the input stage 102, the output stage 104, and/or the GaN die 106 may be in the same die.

In the illustrated example of FIG. 1, the input stage 102 includes an alternating current (AC) voltage source 112 having an AC voltage $V_{LINE}$ coupled to a diode bridge 114 in a configuration to convert $V_{LINE}$ to a DC voltage $V_{DC}$. The diode bridge 114 is a passive diode full-bridge rectifier. $V_{LINE}$ can have an example AC voltage of 110 Vrms, 230 Vrms, etc. Alternatively, the AC voltage source 112 may be a DC voltage source having a voltage in an example range of 85 V to 400 V. In FIG. 1, the diode bridge 114 is coupled to an electromagnetic interference (EMI) pi-filter including a first capacitor ($C_{EMI}$) 116, a first inductor ($L_{EMI}$) 118, and a second capacitor ($C_{BULK}$) 120. For example, $C_{EMI}$ 116, $L_{EMI}$ 118, and $C_{BULK}$ 120 can be coupled to the diode bridge 114 in a configuration to reduce EMI in the power delivery system 100.

In the illustrated example of FIG. 1, the output stage 104 includes a diode ($D_{FW}$) 122 coupled to a third capacitor ($C_{OUT}$) 124, a second inductor ($L_{OUT}$) 126, and a load 128. $C_{OUT}$ 124 is an output buffer capacitor, $L_{OUT}$ 126 is a shielded conductor, and $D_{FW}$ 122 is a freewheeling diode. $D_{FW}$ 122, $C_{OUT}$ 124, and $L_{OUT}$ 126 form a freewheeling loop to generate an output voltage ($V_{OUT}$) across the load 128. $C_{OUT}$ 124 is a capacitor that can filter an inductor current ($I_L$) (e.g., the triangular waveform shaped inductor current) to generate a constant DC current (e.g., a DC current with a relatively low ripple) that can be delivered to the load 128. The load 128 is a light-emitting diode (LED), such as a bulb replacement LED lamp. Alternatively, the load 128 may be any other type of electrical or power consuming device, such as, for example, an Internet-of-Things (IoT) device, a wall power adapter (e.g., an AC-DC wall charger adapter) for a computing device (e.g., a laptop, a smartphone, a tablet, a television, etc.). In some examples, the load 128 can be a component included in and/or otherwise associated with an electric vehicle (EV) or a hybrid-electric vehicle (HEV). For example, the load 128 can be an electronic control unit (ECU), one or more batteries (e.g., Lithium-ion batteries), a motor (e.g., an electric motor), a traction inverter, etc., and/or a combination thereof.

In the illustrated example of FIG. 1, the GaN die 106 includes a high-voltage supply regulator 130, an electrostatic discharge (ESD) active clamp 132, a fourth capacitor ($C_{HV}$) 134, an inverter 136, a first latch 138, a max off timer 140, a logic gate 142, a second latch 144, a blanking circuit 146, and a switch ($Q_S$) 148. Further depicted in the example of FIG. 1 is a fifth capacitor ($C_{AUX}$) 150 coupled to the ESD active clamp 132, the high-voltage supply regulator 130, and an example reference voltage terminal (e.g., a ground terminal) 152. $V_{DD}$ is present at a fourth example node 162. $C_{AUX}$ 150 is used to buffer the supply voltage for the GaN die 106. Further depicted in the example of FIG. 1 is a resistor ($R_{SHUNT}$) (e.g., a shunt resistor) 154 coupled to the gate driver 108, the blanking circuit 146, $Q_S$ 148, and the reference terminal 152. $R_{SHUNT}$ 154 is coupled to the GaN die 106 in a configuration to perform ground-referred current sensing.

In the illustrated example of FIG. 1, the ESD active clamp 132 is coupled to the high-voltage supply regulator 130 in a configuration to provide ESD protection to the high-voltage supply regulator 130, and/or, more generally, the GaN die 106. In the example of FIG. 1, the high-voltage supply regulator 130 has an input terminal coupled to a supple voltage terminal ($V_{DD}$), a first output terminal (PWR_GD), and a second output terminal (UVLO). In FIG. 1, PWR_GD is a power good output coupled to a set input of the first latch 138. For example, the high-voltage supply regulator 130 can assert PWR_GD in response to $V_{DD}$ being greater than a power good threshold and can de-assert PWR_GD in response to $V_{DD}$ being less than the power good threshold. In such examples, the high-voltage supply regulator 130 can set the first latch 138 in response to $V_{DD}$ being greater than the power good threshold causing the first latch 138 to deliver a logic low signal (e.g., a voltage representative of a circuit logic '0') from an output terminal of the first latch 138 to an inverted enable input of the second latch 144. The inverted enable input of the second latch 144 can invert the logic low signal to a logic high signal (e.g., a voltage representative of a circuit logic '1') to enable the second latch 144.

In the illustrated example of FIG. 1, UVLO is an undervoltage lockout output terminal coupled to a reset input terminal of the first latch 138. For example, the high-voltage supply regulator 130 can assert UVLO in response to $V_{DD}$ being less than a UVLO detection voltage threshold and can de-assert UVLO in response to $V_{DD}$ being greater than the UVLO detection voltage threshold. In such examples, the high-voltage supply regulator 130 can reset the first latch 138 in response to $V_{DD}$ being less than the UVLO detection voltage threshold causing the first latch 138 to deliver a logic high signal from the output terminal of the first latch 138 to the inverted enable input terminal of the second latch 144. The inverted enable input terminal of the second latch 144 can invert the logic high signal to a logic low signal to disable the second latch 144.

In the illustrated example of FIG. 1, the input terminal of the high-voltage supply regulator 130 is coupled to $C_{HV}$ 134 and a first current terminal (e.g., a drain, a drain terminal, a power transistor current terminal, etc.) of $Q_S$ 148. A switch voltage ($V_{SW}$) is present at a first example node 156. In the example of FIG. 1, the high-voltage supply regulator 130, $C_{HV}$ 134, and the first current terminal of $Q_S$ 148 are coupled to $D_{FW}$ 122, $L_{OUT}$ 126, and/or, more generally, the output stage 104.

In the illustrated example of FIG. 1, $C_{HV}$ 134 is coupled to an input terminal of the inverter 136 (e.g., an inverter input, an inverter input terminal, etc.). In FIG. 1, the inverter 136 is a Schmitt inverter (e.g., a Schmitt trigger). Alternatively, any other inverter 136 may be used. In FIG. 1, an output terminal of the inverter 136 (e.g., an inverter output, an inverter output terminal, etc.) is coupled to a first input of the logic gate 142. In FIG. 1, the logic gate 142 is an OR logic gate. Alternatively, any other logic gate and/or combination of logic gates may be used. In FIG. 1, the max off timer 140 of FIG. 1 is a timer. In FIG. 1, an output terminal of the max off timer 140 is coupled to a second input terminal of the logic gate 142. In FIG. 1, an input terminal of the max off timer 140 is coupled to an output terminal of the gate driver 108 and a gate (e.g., a gate terminal, a power transistor gate terminal, etc.) of $Q_S$ 148. A gate voltage ($V_{GATE}$) is present at a third example node 160.

In the illustrated example of FIG. 1, an output terminal of the logic gate 142 is coupled to a set input of the second latch 144 and an output terminal of the comparator 110 is coupled to a reset input of the second latch 144. In the example of FIG. 1, an output terminal of the second latch 144 is coupled to a first input of the gate driver 108. A second input (e.g., a feedback input) of the gate driver 108 is coupled to a second current terminal (e.g., a source, a source terminal, etc.) of $Q_S$ 148, an input (e.g., an input terminal) of the blanking circuit 146, and $R_{SHUNT}$ 154. A shunt voltage ($V_{SHUNT}$) is present at a second example node 158. In FIG. 1, a first input (designated with a '+' symbol) of the comparator 110 (e.g., a first comparator input) is coupled to an output terminal of the blanking circuit 146. The voltage at the first input of the comparator 110 is represented by $V_{SIG}$. In FIG. 1, a second input (designated with a '−' symbol) of the comparator 110 (e.g., a second comparator input) is coupled to a reference voltage ($V_{REF}$).

In example operating conditions, the GaN die 106 magnetizes and/or otherwise energizes $L_{OUT}$ 126 in response to turning on and/or otherwise enabling $Q_S$ 148. In response to turning on $Q_S$ 148, $I_L$ associated with $L_{OUT}$ 126 increases and causes energy to be stored in $L_{OUT}$ 126. In example operating conditions, the inductor current is measured by the GaN die 106 based on $V_{SHUNT}$ at the second node 158. In example operating conditions, the comparator 110 can assert a logic high signal in response to determining that $V_{SHUNT}$ is greater than $V_{REF}$. For example, after a blanking time has elapsed as determined by the blanking circuit 146, the comparator 110 can receive $V_{SHUNT}$ to execute a comparison of $V_{SHUNT}$ to $V_{REF}$. In response to the comparator 110 determining that the inductor current has reached and/or otherwise satisfied a current threshold (e.g., a desired peak current), the comparator 110 can assert a logic high signal to reset the second latch 144. In response to the second latch 144 being reset, the second latch 144 delivers a logic low signal to the gate driver 108 and, thus, causing the gate driver 108 to turn off $Q_S$ 148.

In example operating conditions, in response to turning off $Q_S$ 148, the inductor current takes a path (e.g., the freewheeling path) across $D_{FW}$ 122, which causes an output current ($I_{OUT}$) to increase and the inductor current to decrease. The output current can cause a voltage to be stored by $C_{OUT}$ 124, which can cause power to be delivered to the load 128. In example operating conditions, the GaN die 106 can determine when the inductor current reaches approximately zero. For example, $V_{SW}$ at the first node 156 can be stored by $C_{HV}$ 134 and, when the inductor current reaches and/or otherwise substantially approaches zero, the inverter 136 can invert a logic low signal to a logic high signal to invoke the logic gate 142 to assert a logic high signal to the set input of the second latch 144. In response to the second latch 144 receiving the logic high signal at the set input, the second latch 144 can instruct and/or otherwise invoke the gate driver 108 to turn on $Q_S$ 148. In response to turning on $Q_S$ 148, the inductor current begins to increase.

Advantageously, the comparator 110 improves the power delivery system 100 of the example of FIG. 1 by having a reduced input referred offset and an extended DC input common mode range to full rail-to-rail (e.g., from the reference terminal 152 to $V_{DD}$) as described herein. Advantageously, the gate driver 108 improves the power delivery system 100 of the example of FIG. 1 by pulling $V_{GATE}$ up to $V_{DD}$ and by minimizing and/or otherwise reducing the DC cross current to provide driving levels of 0 (e.g., a voltage of the reference terminal 152) and $V_{DD}$ to effectuate safe and reliable turn-on and turn-off operations of $Q_S$ 148 as described herein.

Figure 2:
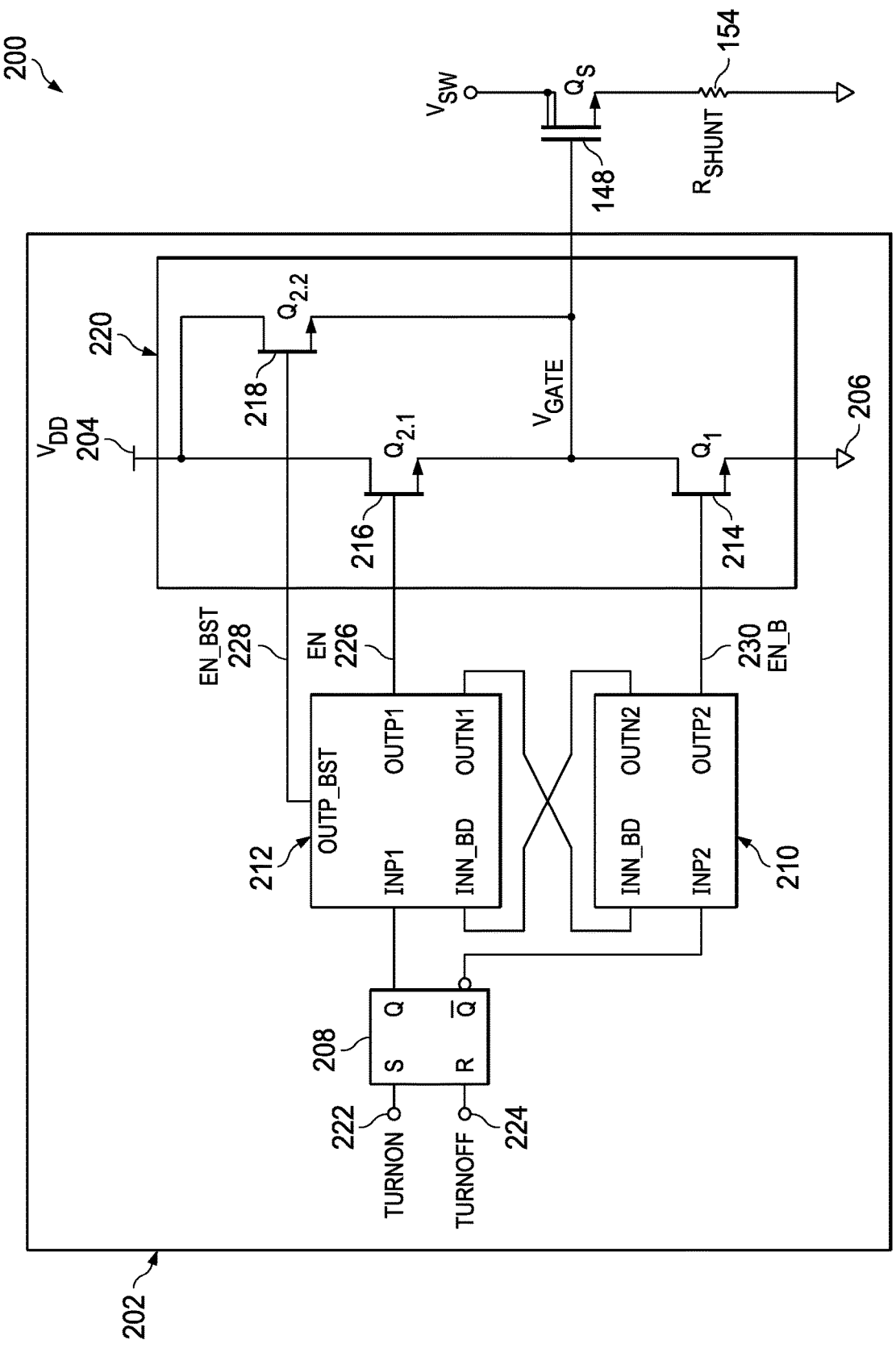
FIG. 2 is a schematic illustration of an example implementation of the gate driver of FIG. 1 including a pre-driver.

FIG. 2 is a schematic illustration of a fourth example gate driver circuit 200 including $Q_S$ 148 and the shunt resistor 154 of FIG. 1. The fourth gate driver circuit 200 includes an example gate driver (e.g., a gate driver circuit) 202 coupled to $Q_S$ 148 of FIG. 1 in a configuration to either turn on or turn off $Q_S$ 148. The gate driver 202 can be an example implementation of the gate driver 108 of FIG. 1. The gate driver 202 is a rail-to-rail (RR) gate driver because the gate driver 202 can provide a driving level of either an example supply voltage terminal ($V_{DD}$) 204 or an example reference voltage terminal (GND) 206 for $Q_S$ 148.

In FIG. 2, the gate driver 202 includes an example latch 208, a first example pre-driver (e.g., pre-driver circuit) 210, a second example pre-driver 212, a first example switch ($Q_1$) 214, and second example switches ($Q_{2.1}$, $Q_{2.2}$) 216, 218. The first pre-driver 210 and the second pre-driver 212 are rail-to-rail pre-drivers (e.g., rail-to-rail pre-driver circuits). The latch 208, the first-pre-driver 210, and the second pre-driver 212 are configured in a cross-coupled arrangement to effectuate non-overlap operation. The first switch 214 and the second switches 216, 218 are N-type E-mode GaN high electron mobility transistors (HEMTs). In FIG. 2, the first pre-driver 210 and the second pre-driver 212 are rail-to-rail pre-drivers. In the example of FIG. 2, a respective drain (e.g., a current terminal, a drain terminal, etc.) of $Q_{2.1}$ 216 and $Q_{2.2}$ 218 are coupled to $V_{DD}$ 204. In the example of FIG. 2, a respective source (e.g., a current terminal, a source terminal, etc.) of $Q_{2.1}$ 216 and $Q_{2.2}$ 218 are coupled to a drain of $Q_1$ 214 and the gate of $Q_S$ 148. In FIG. 2, a source of $Q_1$ 214 is coupled to the reference voltage terminal 206.

In FIG. 2, $Q_1$ 214, $Q_{2.1}$ 216, and $Q_{2.2}$ 218 represent an example output stage (e.g., a gate driver output stage) 220. In the example of FIG. 2, $Q_1$ 214 is coupled to and driven by the first pre-driver 210. In the example of FIG. 2, $Q_{2.1}$ 216 and $Q_{2.2}$ 218 are coupled to and driven by the second pre-driver 212. In example operating conditions, $Q_{2.1}$ 216 is driven with $V_{DD}$ 204 for a relatively quick leading edge of a turn-on signal of $Q_S$ 148. In example operating conditions, $Q_{2.2}$ 218 is driven with a bootstrapped signal greater than $V_{DD}$ 204 to pull the gate of $Q_S$ 148 up to $V_{DD}$ 204.

In the illustrated example of FIG. 2, the first pre-driver 210 has a first input (INP2), a second input (INN_BD), a first output (OUTP2) (e.g., an enable output), and a second output (OUTN2). In FIG. 2, the second pre-driver 212 has a first input (INP1), a second input (INN_BD), a first output (OUTP1), a second output (OUTN1), and a third output (OUTP_BST) (e.g., an enable output). Additionally or alternatively, the first pre-driver 210 may have a third output (OUTP_BST). In FIG. 2, INP1 is coupled to a first output (Q) of the latch 208 and INP2 is coupled to a second output ($\overline{Q}$) of the latch 208.

In FIG. 2, a first example control signal (TURNON) 222 is coupled to a set input (S) of the latch 208. The first control signal 222 can be received from the output of the logic gate 142 of FIG. 1. For example, the first control signal 222 can be asserted in response to an output from the max off timer 140 of FIG. 1 being asserted or the falling edge detection of $C_{HV}$ 134 of FIG. 1 and/or the inverter 136 of FIG. 1. A second example control signal (TURNOFF) 224 is coupled to a reset input (R) of the latch 208. The second control signal 224 can be received from the comparator 110 of FIG. 1. For example, the second control signal 224 can be asserted in response to the comparator 110 detecting a peak current. In FIG. 2, the latch 208 is a set-reset (SR) latch. Alternatively, the latch 208 may be any other type of latch. In some examples, the latch 208 is an example implementation of the second latch 144 of FIG. 1. In some examples, the latch 208 is coupled to the second latch 144 of FIG. 1.

In the illustrated example of FIG. 2, INN_BD of the first pre-driver 210 is coupled to OUTN1 of the second pre-driver 212. In FIG. 2, INN_BD of the second pre-driver 212 is coupled to OUTN2 of the first pre-driver 210. In the example of FIG. 2, OUTP2 of the first pre-driver 210 is coupled to a gate of $Q_1$ 214. In FIG. 2, OUTP1 of the second pre-driver 212 is coupled to a gate of $Q_{2.1}$ 216. In FIG. 2, OUTP_BST of the second pre-driver 212 is coupled to a gate of $Q_{2.2}$ 218.

In example operating conditions, the first control signal 222 is asserted to set the latch 208 and cause the latch 208 to assert a logic high signal to INP1 of the second pre-driver 212. In response to Q being asserted, $\overline{Q}$ is pulled down to a logic low signal to invoke the first pre-driver 210 to pull (e.g., actively pull) a second example enable signal (EN_B) 230 to ground (e.g., to the reference voltage terminal 206) to turn off $Q_1$ 214. In response to INP1 receiving the asserted signal, the second pre-driver 212 asserts a first example enable signal (EN) 226 to turn on $Q_{2.1}$ 216 for a relatively quick leading-edge of the turn signal to enable $Q_S$ 148. In response to INP1 receiving the asserted signal, the second pre-driver 212 asserts an example enable bootstrap signal (EN_BST) 228 to turn on $Q_{2.2}$ 218 to pull a gate voltage ($V_{GATE}$) at the gate of $Q_S$ 148 all the way up to $V_{DD}$ 204.

In example operating conditions, the first control signal 222 is de-asserted and the second control signal 224 is asserted to reset the latch 208. In response to asserting the second control signal 224 and causing $\overline{Q}$ to be asserted high, Q is de-asserted and invokes the second pre-driver 212 to pull (e.g., actively pull) EN 226 and EN_BST 228 to ground (e.g., to the reference voltage terminal 206) to turn off $Q_{2.1}$ 216 and $Q_{2.2}$ 218. In response to resetting the latch 208, the latch 208 asserts a logic high signal to INP2 of the first pre-driver 210. In response to INP2 receiving the logic high signal, the first pre-driver 210 asserts EN_B 230 to turn on $Q_1$ 214 and, thus, pull down $V_{GATE}$ at the gate of $Q_S$ 148 all the way down to GND.

Advantageously, the gate driver 202 of FIG. 2 can generate at least one of EN 226 or EN_BST 228 with a self-timed bootstrap circuit included in the second pre-driver 212. For example, the second pre-driver 212 can generate EN_BST 228 to have a voltage greater than $V_{DD}$ 204 to pull the gate of $Q_S$ 148 up to $V_{DD}$ 204. Advantageously, the gate driver 202 of FIG. 2 can adjust the pull-up path and the pull-down path to turn on and off to minimize and/or otherwise reduce DC cross current. Advantageously, by adjusting the pull-up path and the pull-down path, the gate driver 202 can provide GND from the reference voltage terminal 206 and $V_{DD}$ 204 as the driving levels for safe turn-on and turn-off of $Q_S$ 148 and, thus, effectuate a full rail-to-rail gate driver. Advantageously, the second pre-driver 212, and/or, more generally, the gate driver 202, can effectuate the full rail-to-rail gate driver without any additional voltage rails or terminals.

Figure 3:
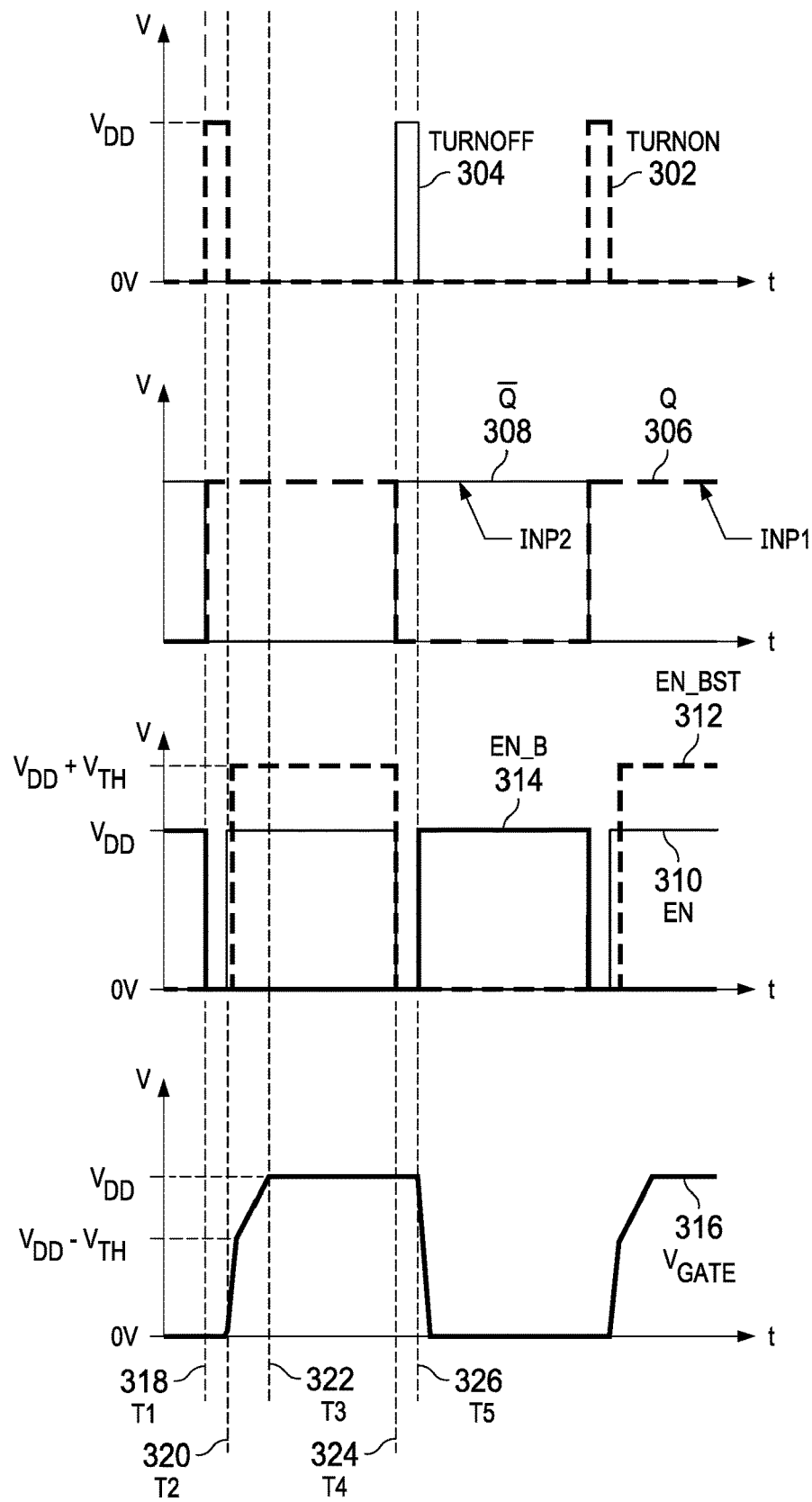
FIG. 3 is an example timing diagram associated with the gate driver of FIGS. 1 and/or 2.

FIG. 3 is an example timing diagram 300 associated with the gate driver 108 of FIG. 1 and/or the gate driver 202 of FIG. 2. The timing diagram 300 of FIG. 3 includes example waveforms 302, 304, 306, 308, 310, 312, 314, 316 associated with the gate driver 108 of FIG. 1 and/or the gate driver 202 of FIG. 2 including a first example waveform 302, a second example waveform 304, a third example waveform 306, a fourth example waveform 308, a fifth example waveform 310, a sixth example waveform 312, a seventh example waveform 314, and an eighth example waveform 316.

In the illustrated example of FIG. 3, the first waveform 302 can correspond to the first control signal 222 of FIG. 2. For example, the first waveform 302 can be representative of the first control signal 222 coupled to the set input of the latch 208 of FIG. 2. In the example of FIG. 3, the second waveform 304 can correspond to the second control signal 224 of FIG. 2. For example, the second waveform 304 can be representative of the second control signal 224 coupled to the reset input of the latch 208. In FIG. 3, the third waveform 306 can correspond to a first signal from the first output (Q) of the latch 208 that can be delivered to INP1 of the second pre-driver 212 of FIG. 2.

In the illustrated example of FIG. 3, the fourth waveform 308 can correspond to a second signal from the second output ($\overline{Q}$) of the latch 208 that can be delivered to INP2 of the first pre-driver 210 of FIG. 2. In the example of FIG. 3, the fifth waveform 310 can correspond to the first enable signal (EN) 226 of FIG. 2. For example, the fifth waveform 310 can be representative of a signal to control (e.g., to turn on, to turn off, etc.) $Q_{2.1}$ 216 of FIG. 2.

In the illustrated example of FIG. 3, the sixth waveform 312 can correspond to the enable bootstrap signal (EN_BST) 228 of FIG. 2. For example, the sixth waveform 312 can be representative of a signal to control (e.g., to turn on, to turn off, etc.) $Q_{2.2}$ 218 of FIG. 2. In the example of FIG. 3, the seventh waveform 314 can correspond to the second enable signal (EN_B) 230 of FIG. 2. For example, the seventh waveform 314 can be representative of a signal to control (e.g., to turn on, to turn off, etc.) $Q_1$ 214 of FIG. 2. In the example of FIG. 3, the eighth waveform 316 can correspond to a gate voltage ($V_{GATE}$) of $Q_S$ 148 of FIGS. 1 and/or 2.

In the timing diagram 300 of FIG. 3, at a first example time (T1) 318, the first waveform 302 is asserted from a first logic level (e.g., a first voltage level) of approximately 0 V to a second logic level (e.g., a second voltage level) of a supply voltage terminal ($V_{DD}$) (e.g., $V_{DD}$ 204 of FIG. 2). At the first time 318, the third waveform 306 is asserted from a logic low level to a logic high level. At the first time 318, the fourth waveform 308 is de-asserted from a logic high level to a logic low level. At the first time 318, the seventh waveform 314 is de-asserted from a first logic high level of VDD to a logic low level of approximately 0 V. For example, at the first time 318, the first control signal 222 can set the latch 208 to invoke the latch 208 to assert a logic high signal to INP1 of the second pre-driver 212 and deliver a logic low signal to INP2 of the first pre-driver 210. In such examples, in response to receiving the logic low signal at INP2, the first pre-driver 210 de-asserts EN_B 230 to turn off $Q_1$ 214.

In the timing diagram 300 of FIG. 3, at a second example time (T2) 320, the first waveform 302 is de-asserted, the fifth waveform 310 is asserted to the first logic level of VDD, the sixth waveform 312 is asserted to a second logic level based on a sum of $V_{DD}$ and $V_{TH}$ (e.g., a threshold voltage ($V_{GS,TH}$) associated with $Q_{2.2}$ 218 of FIG. 2) and/or otherwise a voltage level greater than VDD. At the second time 320, the eighth waveform 316 begins to increase. For example, in response a logic high signal asserted to INP1, the second pre-driver 212 asserts EN 226 to turn on $Q_{2.1}$ 216 and asserts EN_BST 228 to turn on $Q_{2.2}$ 218. In response to turning on $Q_{2.1}$ 216 and $Q_{2.2}$ 218, the gate voltage ($V_{GATE}$) at the gate of the switch 218 increases to turn on $Q_S$ 148. The gate voltage increases from approximately 0 V at the first time 318 to a voltage based on a difference between $V_{DD}$ and $V_{TH}$ (e.g., a threshold voltage $V_{GS,TH}$ associated with $Q_{2.1}$ 216 of FIG. 2) and/or otherwise a voltage level less than VDD at a time shortly after the second time 320. The gate voltage increases from the difference between $V_{DD}$ and $V_{TH}$ to $V_{DD}$ at a third example time (T3) 322.

In the timing diagram 300 of FIG. 3, at a fourth example time (T4) 324, the second waveform 304 is asserted, the third waveform 306 is de-asserted, the fourth waveform 308 is asserted, the fifth waveform 310 is de-asserted, and the sixth waveform 312 is de-asserted. For example, the second control signal 224 can be asserted to reset the latch 208 of FIG. 2 to invoke and/or otherwise cause the latch 208 to de-assert the first output of the latch 208 (e.g., the first latch output) to INP1 and assert the second output of the latch 208 to INP2. In response to receiving the de-asserted first output at INP1, the second pre-driver 212 de-asserts EN 226 and EN_BST 228 of FIG. 2 to turn off $Q_{2.1}$ 216 and $Q_{2.2}$ 218.

In the timing diagram 300 of FIG. 3, at a fifth example time (T5) 326, the second waveform 304 is de-asserted, the seventh waveform 314 is asserted, and the eighth waveform 316 begins to decrease to approximately 0 V. For example, the first pre-driver 210 can assert EN_B 230 to turn on $Q_1$ 214 of FIG. 2 to discharge the gate voltage of the switch 218 to the reference voltage terminal 206 of FIG. 2. Advantageously, the gate driver 108 of FIG. 1 and/or the gate driver 202 of FIG. 2 implement a rail-to-rail gate driver by controlling $Q_S$ 148 with driving levels that extend a full voltage range from 0 V to VDD as demonstrated by the eighth waveform 316 of the timing diagram 300 of FIG. 3.

Figure 4:
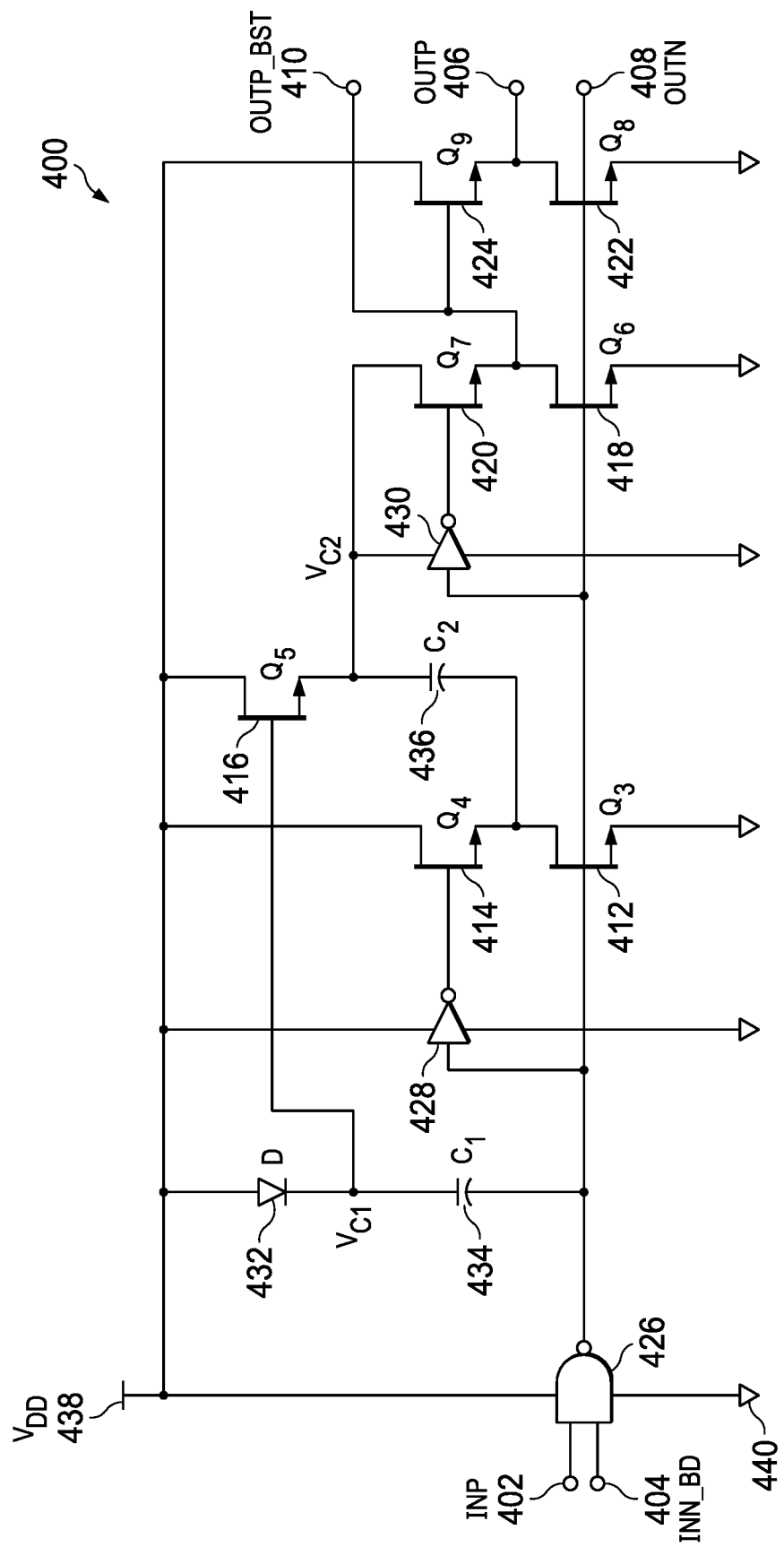
FIG. 4 is a schematic illustration of an example implementation of the pre-driver of FIG. 2.

FIG. 4 is a schematic illustration of a third example pre-driver (e.g., a third pre-driver circuit) 400. In the example of FIG. 4, the third pre-driver 400 can be an example implementation of the first pre-driver 210 and/or the second pre-driver 212 of FIG. 2. The third pre-driver 400 has a first input (INP) 402, a second input (INN_BD) 404, a first output (OUTP) 406, a second output (OUTN) 408, and a third output (OUTP_BST) 410. In FIG. 4, INP 402 can correspond to INP1 of the second pre-driver 212 and/or INP2 of the first pre-driver 210. In FIG. 4, the INN_BD 404 can correspond to INN_BD of the first pre-driver 210 and/or the second pre-driver 212. In FIG. 4, OUTP 406 can correspond to OUTP1 of the first pre-driver 210 and/or OUTP2 of the second pre-driver 212. In FIG. 4, OUTN 408 can correspond to OUTN2 of the first pre-driver 210 and/or OUTN1 of the second pre-driver 212. In FIG. 4, OUTP_BST 410 can correspond to OUTP_BST of the second pre-driver 212.

The third pre-driver 400 includes a third example switch ($Q_3$) 412, a fourth example switch ($Q_4$) 414, a fifth example switch ($Q_5$) 416, a sixth example switch ($Q_6$) 418, a seventh example switch ($Q_7$) 420, an eighth example switch ($Q_8$) 422, and a ninth example switch ($Q_9$) 424. In the example of FIG. 4, $Q_3$ 412, $Q_4$ 414, $Q_5$ 416, $Q_6$ 418, $Q_7$ 420, $Q_8$ 422, and $Q_9$ 424 are N-type E-mode GaN HEMTs.

The third pre-driver 400 includes a first example logic gate 426, a second example logic gate 428, and a third example logic gate 430. In the example of FIG. 4, the first logic gate 426 is a NAND gate (e.g., a NAND logic gate). Alternatively, the NAND gate may be replaced with any other combination of logic gates. In the example of FIG. 4, the second logic gate 428 and the third logic gate 430 are inverters, or inverter logic gates. Alternatively, one or both inverters depicted in the example of FIG. 4 may be replaced with any other combination of logic gates. The third pre-driver 400 includes an example diode (D) 432, a first example capacitor ($C_1$) 434, and a second example capacitor ($C_2$) 436.

The first logic gate 426 has a first input (e.g., a first NAND input) coupled to INP 402 and a second input (e.g., a second NAND input) coupled to INN_BD 404. The first logic gate 426 and the second logic gate 428 are coupled to an example supply voltage terminal ($V_{DD}$) 438 and an example reference voltage terminal 440. $V_{DD}$ at the supply voltage terminal 438 can correspond to $V_{DD}$ 204 of FIG. 2 and/or the reference voltage terminal 440 can correspond to the reference voltage terminal 206 of FIG. 2.

The supply voltage terminal 438 is coupled to an anode of the diode 432, a power input of the second logic gate 428, a drain of $Q_4$ 414, a drain of $Q_5$ 416, and a drain of $Q_9$ 424. A cathode of the diode 432 is coupled to a first plate of $C_1$ 434 and a gate of $Q_5$ 416. An output terminal (e.g., an inverted output, an inverted output terminal, etc.) of the first logic gate 426 (e.g., a NAND output, a NAND logic gate output, etc.) is coupled to a second plate of $C_1$ 434, an input terminal of the second logic gate 428, a gate of $Q_3$ 412, an input terminal of the third logic gate 430, a gate of $Q_6$ 418, a gate of $Q_8$ 422, and OUTN 408. An output terminal of the second logic gate 428 is coupled to a gate of $Q_4$ 414. A source of $Q_5$ 416 is coupled to a first plate of $C_2$ 436, a power input of the third logic gate 430, and a drain of $Q_7$ 420. A source of $Q_4$ 414 is coupled to a drain of $Q_3$ 412 and a second plate of $C_2$ 436. A source of $Q_7$ 420 is coupled to a drain of $Q_6$ 418, a gate of $Q_9$ 424, and OUTP_BST 410. A source of $Q_9$ 424 is coupled to OUTP 406 and a drain of $Q_8$ 412.

In example operating conditions, $C_2$ 436 is pre-charged to $V_{DD}$ of the supply voltage terminal 438. In response to INP 402 and INN_BD 404 going high and/or otherwise being asserted, the first logic gate 426 de-asserts an output of the first logic gate 426. In response to the first logic gate 426 de-asserting the output, OUTN 408 is de-asserted. The second logic gate 428 inverts the de-asserted output to an asserted output and/or otherwise output a logic high signal. In response to the second logic gate 428 outputting a logic high signal, the gate of $Q_4$ 414 is pulled up to $V_{DD}$ of the supply voltage terminal 438. In response to the gate of $Q_4$ 414 being pulled up to $V_{DD}$ of the supply voltage terminal 438, the source of $Q_4$ 414 and, thus, the second plate of $C_2$ 436 has a voltage based on a difference between $V_{DD}$ 438 and a threshold voltage of $Q_4$ 414 ($V_{GS,TH,Q4}$). The first plate of $C_2$ 436 thereby has a voltage of the second plate potential of $C_2$ 436 plus the pre-charged $V_{DD}$ of the supply voltage terminal 438. Accordingly, the first plate of $C_2$ 436 can have a voltage of $2*V_{DD}-V_{GS,TH,Q4}$.

In example operating conditions, the gate of $Q_7$ 420 is pulled up to the voltage of $2*V_{DD}-V_{GS,TH,Q4}$. The source of $Q_7$ 420, which is coupled to OUTP_BST 410, thereby has a voltage of $2*V_{DD}-V_{GS,TH,Q4}-V_{GS,TH,Q7}$, which is equivalent to a difference between $2*V_{DD}$ and $2*V_{GS,TH}$ ($2*V_{DD}-2*V_{GS,TH}$). In example operating conditions, the voltage of OUTP_BST 410 can cause $Q_{2.2}$ 218 of FIG. 2 to turn on. In example operating conditions, $V_{GS,TH}$ is less than one-third of $V_{DD}$ to generate a boundary condition based on the following relationships:

$$OUTP\_BST=(2*V_{DD})-(2*V_{TH})=(2*V_{DD})-(2/3*V_{DD})$$
$$=4/3*V_{DD}=V_{DD}+V_{TH}$$

Figure 5:
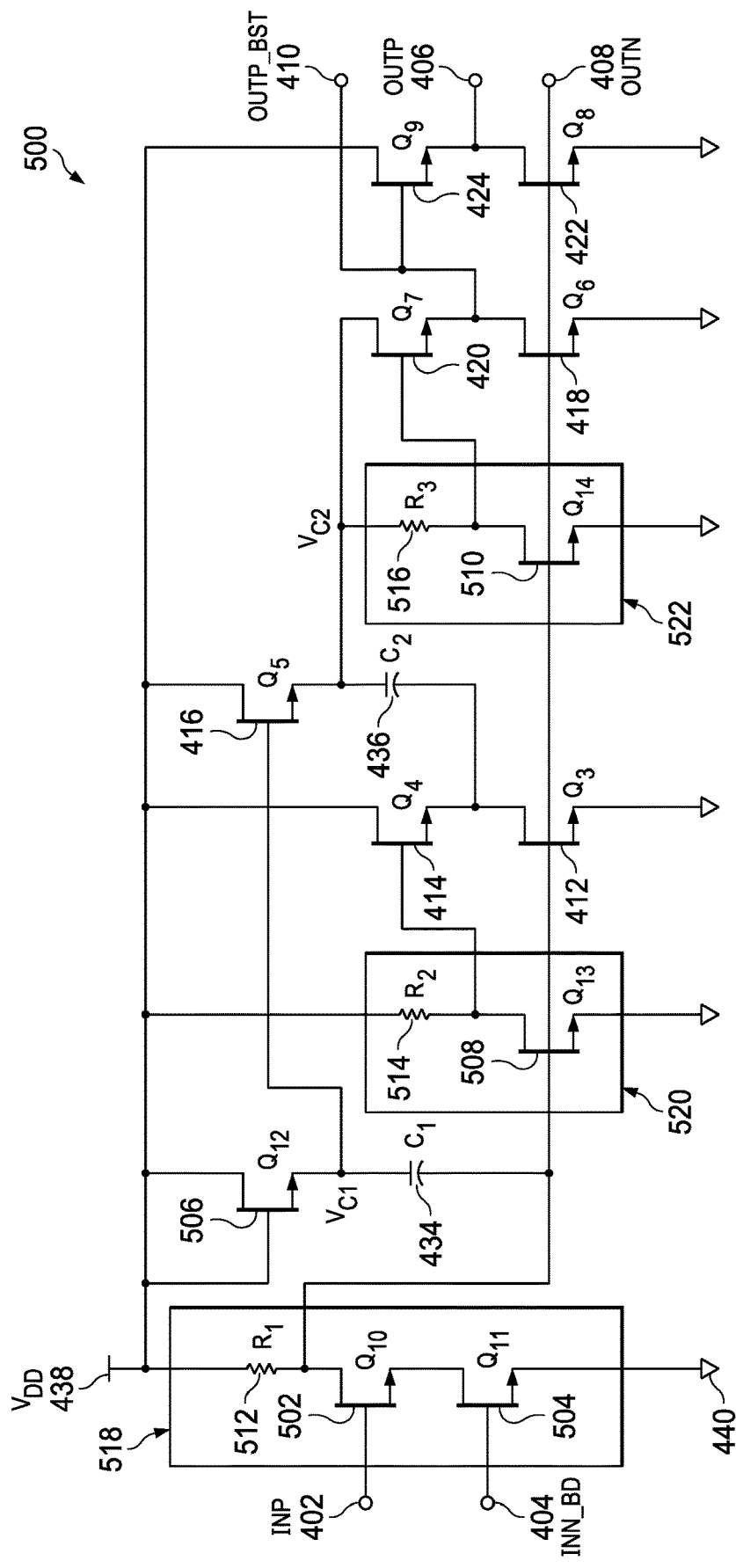
FIG. 5 is a schematic illustration of another example implementation of the pre-driver of FIG. 3.

FIG. 5 is a schematic illustration of a fourth example pre-driver (e.g., a fourth pre-driver circuit) 500. The fourth pre-driver 500 can be an example implementation of the first pre-driver 210 and/or the second pre-driver 212 of FIG. 2. The fourth pre-driver 500 has the first input (INP) 402, the second input (INN_BD) 404, the first output (OUTP) 406, the second output (OUTN) 408, and the third output (OUTP_BST) 410 of FIG. 4. The fourth pre-driver 500 includes $Q_3$ 412, $Q_4$ 414, $Q_5$ 416, $Q_6$ 418, $Q_7$ 420, $Q_8$ 422, $Q_9$ 424, $C_1$ 434, $C_2$ 436, and the supply voltage terminal 438 of FIG. 4.

The fourth pre-driver 500 includes a tenth example switch ($Q_{10}$) 502, an eleventh example switch ($Q_{11}$) 504, a twelfth example switch ($Q_{12}$) 506, a thirteenth example switch ($Q_{13}$) 508, a fourteenth example switch ($Q_{14}$) 510, a first example resistor ($R_1$) 512, a second example resistor ($R_2$) 514, and a third example resistor ($R_3$) 516. The tenth switch 502, the eleventh switch 504, the twelfth switch 506, the thirteenth switch 508, and the fourteenth switch 510 are N-type E-mode GaN transistors.

$Q_{10}$ 502, $Q_{11}$ 504, and $R_1$ 512 can be coupled together in an arrangement to form an example implementation of a NAND logic gate 518. For example, $Q_{10}$ 502, $Q_{11}$ 504, and $R_1$ 512 can be an implementation of the first logic gate 426 of FIG. 4. $Q_{13}$ 508 and $R_2$ 514 can be coupled together in an arrangement to form an example implementation of a first inverter logic gate 520. For example, $Q_{13}$ 508 and $R_2$ 514 can be an implementation of the second logic gate 428 of FIG. 4. $Q_{14}$ 510 and $R_3$ 516 can be coupled together in an arrangement to form an example implementation of a second inverter logic gate 522. For example, $Q_{14}$ 510 and $R_3$ 516 can be an implementation of the third logic gate 430 of FIG. 4.

In example operating conditions, $Q_{12}$ 506 is turned on causing $V_{C1}$ to be approximately a difference between $V_{DD}$ of the supply voltage terminal 438 and a threshold voltage $V_{GS,TH}$ of $Q_{12}$ 506. In example operating conditions, in response to INP 402 being asserted, INN_BD 404 being asserted, or neither INP 402 or INN_BD 404 being asserted, a logic high signal is asserted at the second plate of $C_1$ 434 and respective gates of $Q_{13}$ 508, $Q_3$ 412, $Q_{14}$ 410, $Q_6$ 418, and $Q_8$ 422 to turn on the respective switches. In response to turning on $Q_{13}$ 508, $V_{C1}$ becomes a difference between two times $V_{DD}$ of the supply voltage terminal 438 and the threshold voltage of $Q_{12}$ 506 (e.g., $V_{C1}=2*V_{DD}-V_{TH}$). In example operating conditions, in response to INP 402 and INN_BD 404 being asserted, a logic low signal is delivered to the second plate of $C_1$ 434 and the respective gates of $Q_{13}$ 508, $Q_3$ 412, $Q_{14}$ 510, $Q_6$ 418, and $Q_8$ 422 to turn off the respective switches.

In example operating conditions, $C_1$ 434 is used to bootstrap $Q_5$ 416 to charge $C_2$ 436 to $V_{DD}$ of the supply voltage terminal 438 in response to turning on $Q_3$ 412 and $Q_5$ 416. In response to charging $C_2$ 436 to have a voltage of $V_{DD}$ of the supply voltage terminal, $Q_7$ 420 is turned on to assert a logic high signal at OUTP_BST 410, where the logic high signal can correspond to a sum of $V_{DD}$ of the supply voltage terminal and a threshold voltage of $Q_7$ 420. In response to turning on $Q_7$ 420, $Q_9$ 424 is turned on to assert a logic high signal at OUTP 406, where the logic high signal can correspond to $V_{DD}$ of the supply voltage terminal 438. To turn off the fourth pre-driver 500, $Q_6$ 418 and $Q_8$ 422 are turned on to de-assert the logic high signals at OUTP 406 and OUTP_BST 410.

FIG. 6 depicts graphs 600, 602 of example waveforms 604, 606, 608, 610, 612 associated with the first pre-driver 210 of FIG. 2, the second pre-driver 212 of FIG. 2, the third pre-driver 400 of FIG. 4 and/or the fourth pre-driver 500 of FIG. 5. The waveforms 604, 606, 608, 610, 612 include a first example waveform 604, a second example waveform 606, a third example waveform 608, a fourth example waveform 610, and a fifth example waveform 612.

The graphs 600, 602 depict example operating conditions during startup or initialization of the first pre-driver 210 of FIG. 2, the second pre-driver 212 of FIG. 2, the third pre-driver 400 of FIG. 4 and/or the fourth pre-driver 500 of FIG. 5. The first waveform 604 can correspond to a voltage at INP1 and/or INP2 of FIG. 2, INP 402 of FIGS. 4-5, etc. The second waveform 606 can correspond to a voltage at OUTP of FIG. 2, OUTP 406 of FIGS. 4-5, etc. The third waveform 608 can correspond to $V_{DD}$ 204 of FIG. 2, $V_{DD}$ of the supply voltage terminal 438 of FIGS. 4-5, etc. The fourth waveform 610 can correspond to $V_{C1}$ of FIGS. 4-5. The fifth waveform 612 can correspond to $V_{C2}$ of FIGS. 4-5.

During startup, the third waveform 608 begins to increase at a first example time (t1) 614, the fourth waveform 610 begins to increase at a second example time (t2) 616, and the fifth waveform 612 begins to increase at a third example time (t3) 618.

The third waveform 608 increases from the first time 614 to a first voltage (e.g., a voltage in a range of 0 V to 6 V) at a fourth example time (t4) 620. The fourth waveform 610 increases from the second time 616 to a second voltage (e.g., a voltage in a range of 0 V to 4 V) at the fourth time 620. The fifth waveform 612 increases from the third time 618 to a third voltage (e.g., a voltage in a range of 0 V to 2 V) at the fourth time 620.

FIG. 7 is an example timing diagram 700 associated with the first pre-driver 210 of FIG. 2, the second pre-driver 212 of FIG. 2, the third pre-driver 400 of FIG. 4, and/or the fourth pre-driver 500 of FIG. 5. The timing diagram 700 includes example waveforms 702, 704, 706, 708, 710, 712, 714, 716 including a first example waveform 702, a second example waveform 704, a third example waveform 706, a fourth example waveform 708, a fifth example waveform 710, a sixth example waveform 712, and a seventh example waveform 714, and an eighth example waveform 716.

Further depicted in the timing diagram 700 of FIG. 7 are a first example voltage level 718 based on a sum of $V_{DD}$ and $V_{TH}$, a second example voltage level 720 being $V_{DD}$, and a third example voltage level 722 being 0 V. Also depicted in the timing diagram 700 are a fourth example voltage level 724 based on a difference between $2*V_{DD}$ and $V_{TH}$, and a fifth example voltage level 726 based on a difference between $V_{DD}$ and $V_{TH}$.

The first waveform 702 can correspond to $V_{DD}$ 204 of FIG. 2 and/or $V_{DD}$ of the supply voltage terminal 438 of FIGS. 4-5. The second waveform 704 can correspond to a voltage of INP of FIG. 2 and/or INP 402 of FIGS. 4-5. The third waveform 706 can correspond to a voltage of INN_BD of FIG. 2 and/or INN_BD of FIGS. 4-5. The fourth waveform 708 can correspond to a voltage of OUTN of FIG. 2 and/or OUTN 408 of FIGS. 4-5. The fifth waveform 710 can correspond to a voltage of OUTP of FIG. 2 and/or OUTP 406 of FIGS. 4-5. The sixth waveform 712 can correspond to a voltage of OUTP of FIG. 2 and/or OUTP_BST 410 of FIGS. 4-5. The seventh waveform 714 can correspond to a voltage of $V_{C2}$ of FIGS. 4-5. The eighth waveform 716 can correspond to a voltage of $V_{C1}$ of FIGS. 4-5.

At a first example time (t1) 728, INP is asserted, INN_BD is de-asserted, and OUTN is asserted (e.g., the first logic gate 426 of FIG. 4 asserts a logic high signal to OUTN 408). At the first time 728, $V_{C2}$ is at the second voltage level 720, which is $V_{DD}$, and $V_{C1}$ is at the fourth voltage level 724. For example, at the first time 728, $V_{C2}$ in FIG. 4 is $V_{DD}$ because Q₃ 412 is turned on and pulls the bottom plate of C₂ 436 to ground potential. In such examples, at the first time 728, $V_{C1}$ is at a voltage potential based on a difference between 2*VDD and a voltage drop ($V_{D,TH}$) across D 432. In some such examples, the gate of Q₅ 416 is connected to this voltage potential and, thus, C₂ 436 is charged to $V_{DD}$. In some such examples, at the first time 728, C₁ 434 can turn on Q₅ 416 to cause $V_{C2}$ to be at $V_{DD}$.

At a second example time (t2) 730, INP and INN_BD are asserted, which causes OUTN to be de-asserted (e.g., the first logic gate 426 outputs a logic low signal to OUTN 408). At the second time 730, $V_{C2}$ increases from the second voltage level 720 to the fourth voltage level 724 and $V_{C1}$ decreases from the fourth voltage level 724 to the fifth voltage level 726. For example, at the second time 730, C₁ 434 can charge to a voltage of $V_{DD}-V_{D,TH}$. In response to OUTN being de-asserted, a logic gate 428 asserts a logic high signal to the gate of Q4 414. The second plate of C2 436 is pushed to a voltage based on a difference between VDD of the supply voltage terminal 438 and $V_{TH,Q4}$ of transistor Q4 414. This causes $V_{C2}$ to increase to a voltage based on a difference between $2*V_{DD}$ and a threshold voltage ($V_{TH,Q4}$) of transistor Q4 414.

At the second time 730, OUTP and OUTP_BST begin to increase. At a third example time (t3) 732, OUTP and OUTP_BST is at $V_{DD}$ (e.g., increased from 0 V). For example, at the second time 730, the logic low signal of OUTN is inverted to a logic high signal by the third logic gate 430 of FIGS. 4-5 to turn on Q₇ 420, which causes the fourth voltage level 724 (e.g., $2*V_{DD}-V_{TH}$) to be output at OUTP_BST at the third time 732. In such examples, at the second time 730, in response to turning on Q₇ 420, Q₉ 424 is turned on to output the second voltage level 720 (e.g., $V_{DD}$) at OUTP at the third time 732.

Advantageously, the pre-drivers 210, 212, 400, 500 of FIGS. 2, 4, and/or 5, and/or, more generally, the gate driver 108 of FIG. 1 and/or the gate driver 202 of FIG. 2, can turn on $Q_{2.2}$ 218 of FIG. 2 with a voltage greater than $V_{DD}$ 204 of FIG. 2. Advantageously, the pre-drivers 210, 212, 400, 500 of FIGS. 2, 4, and/or 5, and/or, more generally, the gate driver 108 of FIG. 1 and/or the gate driver 202 of FIG. 2, can turn on $Q_{2.1}$ 216 of FIG. 2 with $V_{DD}$ 204 to turn on $Q_S$ 148 of FIGS. 1 and/or 2 with $V_{DD}$ 204 to implement a full rail-to rail voltage driver.

Figure 8:
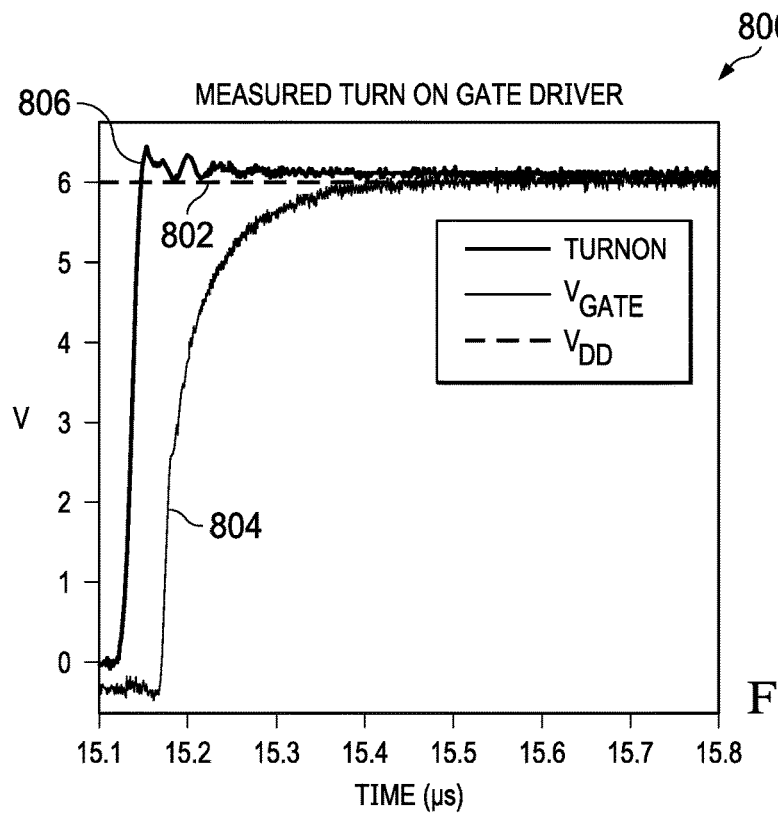
FIG. 8 depicts a graph of example waveforms associated with turning on the gate driver of FIGS. 1 and/or 2.

FIG. 8 depicts a graph 800 of example waveforms 802, 804, 806 associated with turning on the gate driver 108 of FIG. 1 and/or the gate driver 202 of FIG. 2. The waveforms 802, 804, 806 include a first example waveform 802, a second example waveform 804, and a third example waveform 806. The first waveform 802 can correspond to $V_{DD}$ 204 of FIG. 2 and/or $V_{DD}$ of the supply voltage terminal 438 of FIGS. 4-5. The second waveform 804 can correspond to $V_{GATE}$ of FIGS. 1 and 2. The third waveform 806 can correspond to the first control signal 222 of FIG. 2.

Advantageously, the pre-drivers 210, 212, 400, 500 of FIGS. 2, 4, and/or 5, and/or, more generally, the gate driver 108 of FIG. 1 and/or the gate driver 202 of FIG. 2, in response to asserting the first control signal 222, can turn on $Q_S$ 148 of FIGS. 1 and 2 by increasing $V_{GATE}$ from a first voltage (e.g., a voltage below 0 V) to a second voltage (e.g., a voltage of approximately 6 V) to implement a full rail-to-rail driver with a high-driving voltage level of approximately $V_{DD}$.

Figure 9:
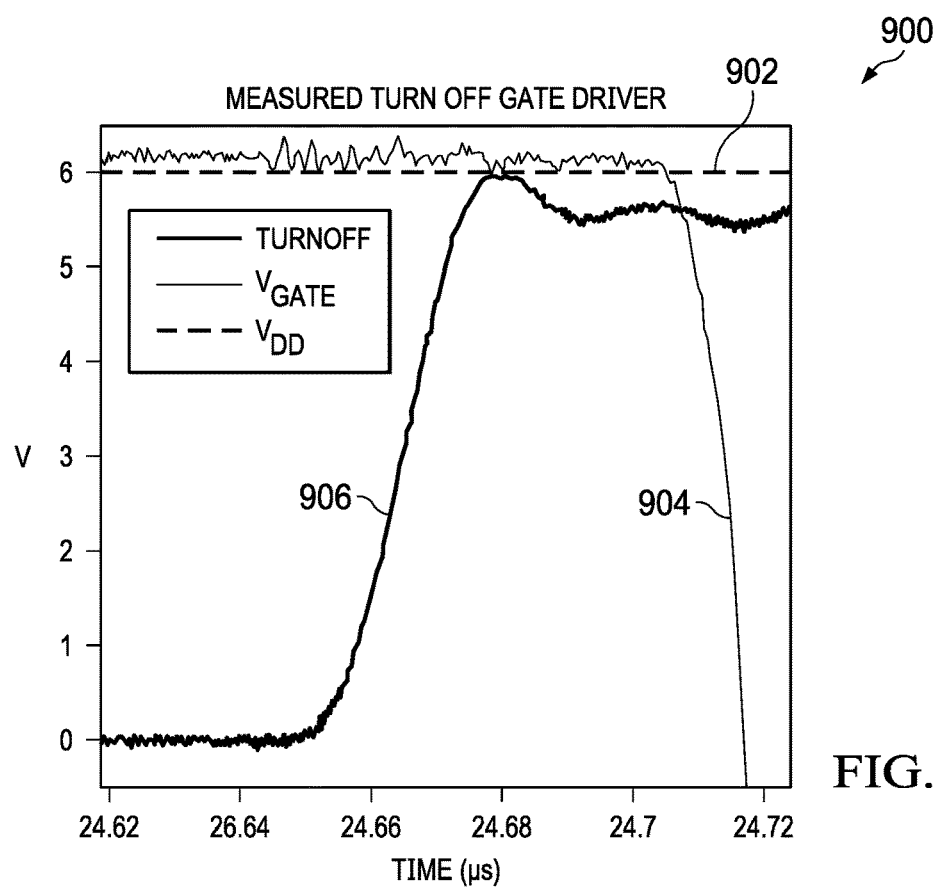
FIG. 9 depicts a graph of example waveforms associated with turning off the gate driver of FIGS. 1 and/or 2.

FIG. 9 depicts a graph 900 of example waveforms 902, 904, 906 associated with turning off the gate driver of 108 of FIG. 1 and/or the gate driver 202 of FIG. 2. The waveforms 902, 904, 906 include a first example waveform 902, a second example waveform 904, and a third example waveform 906. The first waveform 902 can correspond to $V_{DD}$ 204 of FIG. 2 and/or $V_{DD}$ of the supply voltage terminal 438 of FIGS. 4-5. The second waveform 904 can correspond to $V_{GATE}$ of FIGS. 1 and 2. The third waveform 906 can correspond to the second control signal 224 of FIG. 2.

Advantageously, the pre-drivers 210, 212, 400, 500 of FIGS. 2, 4, and/or 5, and/or, more generally, the gate driver 108 of FIG. 1 and/or the gate driver 202 of FIG. 2, in response to asserting the second control signal 224, can turn off $Q_S$ 148 of FIGS. 1 and 2 by decreasing $V_{GATE}$ from a first voltage (e.g., a voltage of approximately 6 V) to a second voltage (e.g., a voltage below 0 V) to implement a full rail-to-rail driver with a low-driving voltage level of approximately 0 V.

Advantageously, the pre-drivers 210, 212, 400, 500 of FIGS. 2, 4, and/or 5, and/or, more generally, the gate driver 108 of FIG. 1 and/or the gate driver 202 of FIG. 2, can implement a rail-to-rail gate driver without an additional voltage rail or terminal, an additional charge pump circuit, etc. Advantageously, the pre-drivers 210, 212, 400, 500 of FIGS. 2, 4, and/or 5, and/or, more generally, the gate driver 108 of FIG. 1 and/or the gate driver 202 of FIG. 2, can dynamically generate a bootstrapped voltage (e.g., a voltage at the gate of $Q_{2.2}$ 218 of FIG. 2).

Advantageously, the pre-drivers 210, 212, 400, 500 of FIGS. 2, 4, and/or 5, and/or, more generally, the gate driver 108 of FIG. 1 and/or the gate driver 202 of FIG. 2, can implement a rail-to-rail gate driver using one bootstrap stage (e.g., $Q_{2.2}$ 218). Advantageously, the pre-drivers 210, 212, 400, 500 of FIGS. 2, 4, and/or 5, and/or, more generally, the gate driver 108 of FIG. 1 and/or the gate driver 202 of FIG. 2, can implement a rail-to-rail gate driver by splitting a single pull-up transistor into at least two transistors (e.g., $Q_{2.1}$ 216 and $Q_{2.2}$ 218) as depicted in the example of FIG. 2.

Advantageously, by splitting the single pull-up transistor into at least two transistors, the fourth gate driver circuit 200 of FIG. 2 can effectuate improved switching behavior (e.g., more efficient switching behavior) because the bootstrapped signal (e.g., EN_BST 228 of FIG. 2) does not need to drive the full output stage, but, instead, in some examples, can drive a portion of the full output stage. For example, the second pre-driver 212 of FIG. 2 can assert EN_BST 228 to drive a portion of $V_{GATE}$ of FIG. 2.

Figure 10:
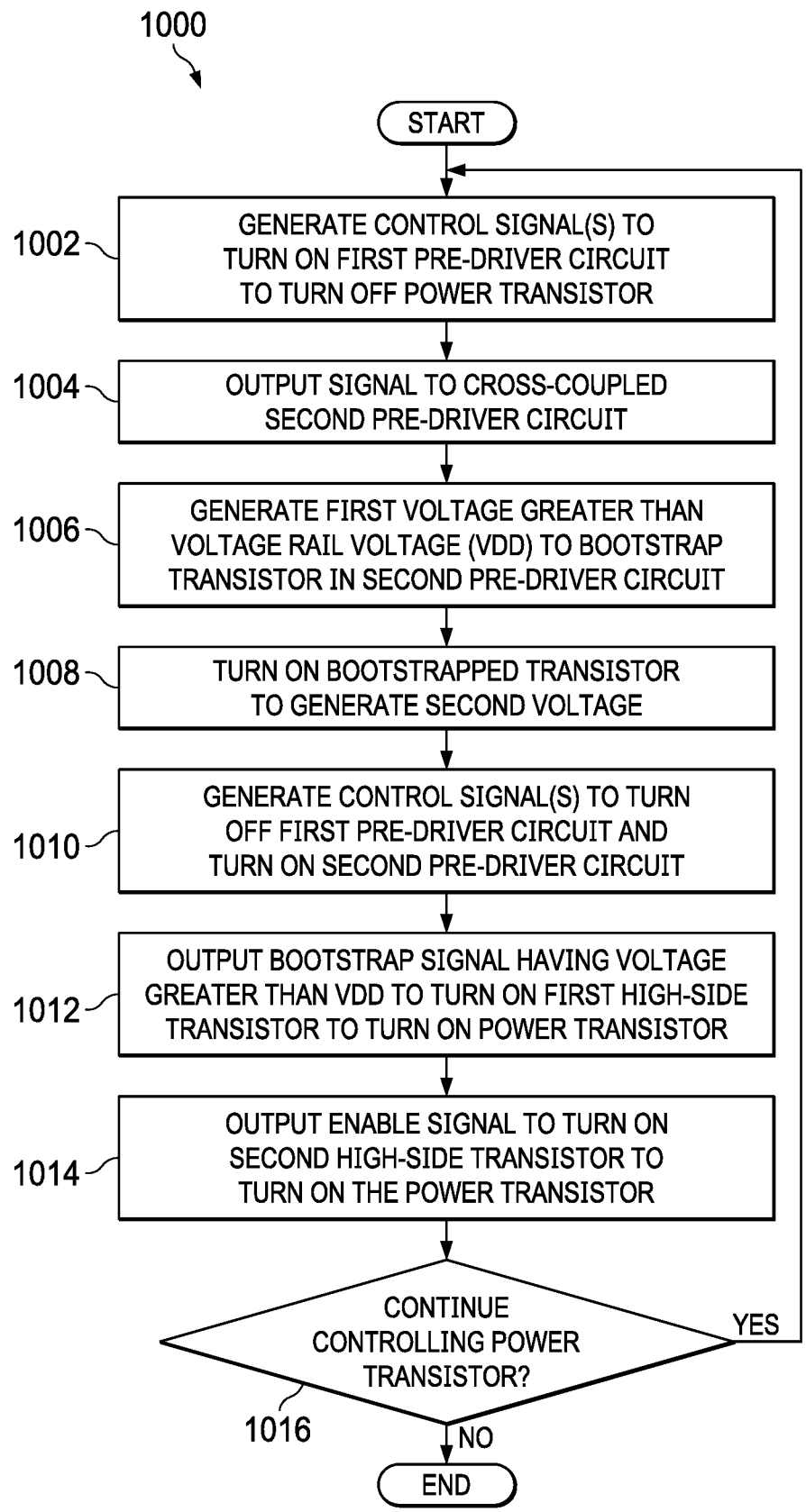
FIG. 10 is a flowchart representative of an example process that may be carried out while utilizing machine readable instructions that can be executed and/or hardware configured to implement the gate driver of FIGS. 1 and/or 2 to control a power transistor.

A flowchart representative of an example process that may be carried out while utilizing example hardware logic, example machine readable instructions (e.g., hardware readable instructions), example hardware implemented state machines, and/or any combination thereof for implementing the gate driver 108 of FIG. 1 and/or the gate driver 202 of FIG. 2 is shown in FIG. 10. The example machine readable instructions may be one or more executable programs or portion(s) of an executable program for execution by programmable processor(s), programmable controller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)). The program may be embodied in software stored on a non-transitory computer readable storage medium such as a non-volatile memory, volatile memory, etc., but the entire program and/or parts thereof could alternatively be executed by any other device (e.g., programmable device) and/or embodied in firmware or dedicated hardware. Further, although the example program is described with reference to the flowchart illustrated in FIG. 10, many other methods of implementing the example gate driver 108 of FIG. 1 and/or the example gate driver 202 of FIG. 2 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example process of FIG. 10 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

FIG. 10 is a flowchart representative of an example process 1000 that may be carried out while utilizing machine readable instructions that can be executed and/or hardware configured to implement the gate driver 108 of FIG. 1 and/or the gate driver 202 of FIG. 2 to control a power transistor, such as $Q_S$ 148 of FIG. 1. The example process 1000 of FIG. 10 begins at block 1002, at which the gate driver 108 and/or the gate driver 202 generates control signal(s) to turn on a first pre-driver circuit to turn off a power transistor. For example, an assertion of the second control signal 224 can be generated to reset the latch 208 of FIG. 2. In such examples, the latch 208 can de-assert a first signal at INP1 of the second pre-driver 212 and assert a second signal at INP2 of the first pre-driver 210. In response to asserting the second signal at INP2, the first pre-driver 210 asserts EN_B 230 to turn on $Q_1$ 214 of FIG. 2. In response to turning on $Q_1$ 214, $Q_S$ 148 turns off.

At block 1004, the gate driver 108 and/or the gate driver 202 output a signal to a cross-coupled second pre-driver circuit. For example, the first pre-driver circuit 210 can output an assertion of OUTN2 and transmit the assertion of OUTN2 to INN_BD of the second pre-driver 212.

At block 1006, the gate driver 108 and/or the gate driver 202 generate a first voltage greater than a voltage of a supply voltage terminal (VDD) to bootstrap a transistor in the second pre-driver circuit. For example, the first logic gate 426 of FIG. 4 can assert a logic high signal in response to INP 402 being de-asserted and INN_BD 404 being asserted (e.g., OUTN2 from the first pre-driver circuit 210 being asserted and transmitted to INN_BD 404 of the second pre-driver 212). In such examples, the first logic gate 426 can assert the logic high signal to cause $V_{C1}$ of FIG. 4 to become $2*V_{DD}-V_{TH}$ (e.g., the fourth voltage level 724 of FIG. 7), which is greater than VDD of the supply voltage terminal 438, to bootstrap the gate of $Q_5$ 416 of FIG. 4 and, thus, turn on $Q_5$ 416. In some such examples, the first logic gate 426 can assert the logic high signal to turn on $Q_3$ 412 to charge $C_2$ 436 to VDD of the supply voltage terminal 438 when $Q_5$ 416 is on.

At block 1008, the gate driver 108 and/or the gate driver 202 turn on the bootstrapped transistor to generate a second voltage. For example, $C_1$ 434 can be used to turn on $Q_5$ 416 to charge $C_2$ 436 to $V_{DD}$ of the supply voltage terminal 438 in response to $Q_5$ 416 and $Q_3$ 412 being turned on.

At block 1010, the gate driver 108 and/or the gate driver 202 generate control signal(s) to turn off the first pre-driver circuit and turn on the second pre-driver circuit. For example, an assertion of the first control signal 222 can be generated to set the latch 208. In such examples, the latch 208 can assert the first signal at INP1 of the second pre-driver 212 and de-assert the second signal at INP2 of the first pre-driver 210.

At block 1012, the gate driver 108 and/or the gate driver 202 output a bootstrap signal having a voltage greater than VDD to turn on a first high-side transistor to turn on the power transistor. For example, in response to asserting the first signal at INP1, the second pre-driver 212 asserts EN_BST 228 to turn on a first high-side transistor, such as $Q_{2.2}$ 218 of FIG. 2. The gate of $Q_{2.2}$ 218 is driven with a bootstrapped signal greater than $V_{DD}$ 204 to pull the gate of $Q_S$ 148 up to VDD 204. For example, the first logic gate 426 can de-assert a logic signal to invoke the second logic gate 428 to turn on $Q_4$ 414 and invoke the third logic gate 430 to turn on $Q_7$ 420. In response to turning on $Q_7$ 420, a voltage of $V_{DD}+V_{TH}$ is transferred to OUTP_BST 410.

At block 1014, the gate driver 108 and/or the gate driver 202 output an enable signal to turn on a second high-side transistor to turn on the power transistor. For example, in response to asserting the first signal at INP1, the second pre-driver 212 asserts EN 226 to turn on a second high-side transistor, such as $Q_{2.1}$ 216 of FIG. 2. The gate of $Q_{2.1}$ 216 is driven with $V_{DD}$ 204 for a quick leading edge of the turn on of $Q_S$ 148. For example, the first logic gate 426 can de-assert a logic signal to invoke the second logic gate 428 to turn on $Q_4$ 414 and invoke the third logic gate 430 to turn on $Q_7$ 420. In response to turning on $Q_7$ 420, a voltage of VDD is transferred to OUTP 406.

At block 1016, the gate driver 108 and/or the gate driver 202 determine whether to continue controlling the power transistor. If, at block 1016, the gate driver 108 and/or the gate driver 202 determine to continue controlling the power transistor, control returns to block 1002 to generate control signal(s) to turn on the first pre-driver circuit to turn off the power transistor, otherwise the example process 1000 of FIG. 10 concludes.

Figure 11:
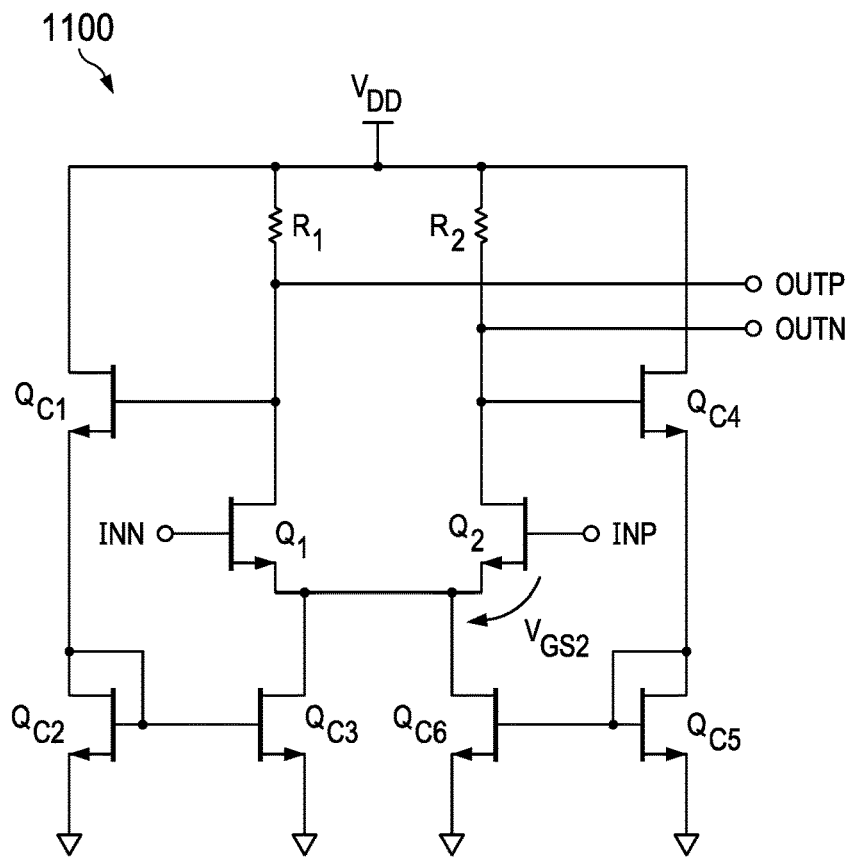
FIG. 11 is a schematic illustration of a differential amplifier that can be an input stage of a comparator circuit.

FIG. 11 is a schematic illustration of a differential amplifier 1100 that can be an input stage of a comparator circuit. The differential amplifier 1100 includes N-type E-mode GaN transistors $Q_1$, $Q_2$, $Q_{C1}$, $Q_{C2}$, $Q_{C3}$, $Q_{C4}$, $Q_{C5}$, $Q_{C6}$, and resistors $R_1$ and $R_2$ arranged in a configuration to amplify a difference between an input voltage (INP) and a reference voltage (INN). The differential amplifier 1100 can generate an amplified output signal (OUTP−OUTN) based on the difference. For example, the amplified output signal can be 10*(INP−INN), 20*(INP−INN), etc.

As $Q_1$ and $Q_2$ are N-type E-mode GaN transistors, a respective one of $Q_1$ and $Q_2$ are turned on with a voltage greater than a threshold voltage ($V_{GS,TH}$) of the respective one of $Q_1$ and $Q_2$. Accordingly, the differential amplifier 1100 may have a reduced voltage range that can be used for INN and INP because lower voltages for INN and INP may not be high enough to turn on a respective one of $Q_1$ and $Q_2$. The accuracy of the differential amplifier 1100 is based on matching $Q_1$ and $Q_2$. However, if $Q_1$ and $Q_2$ are based on the semiconductor wafer, then even if $Q_1$ and $Q_2$ have the same size, $Q_1$ and $Q_2$ may be mismatched and, thus, can cause the differential amplifier 1100 to have a relatively large offset voltage.

Figure 12:
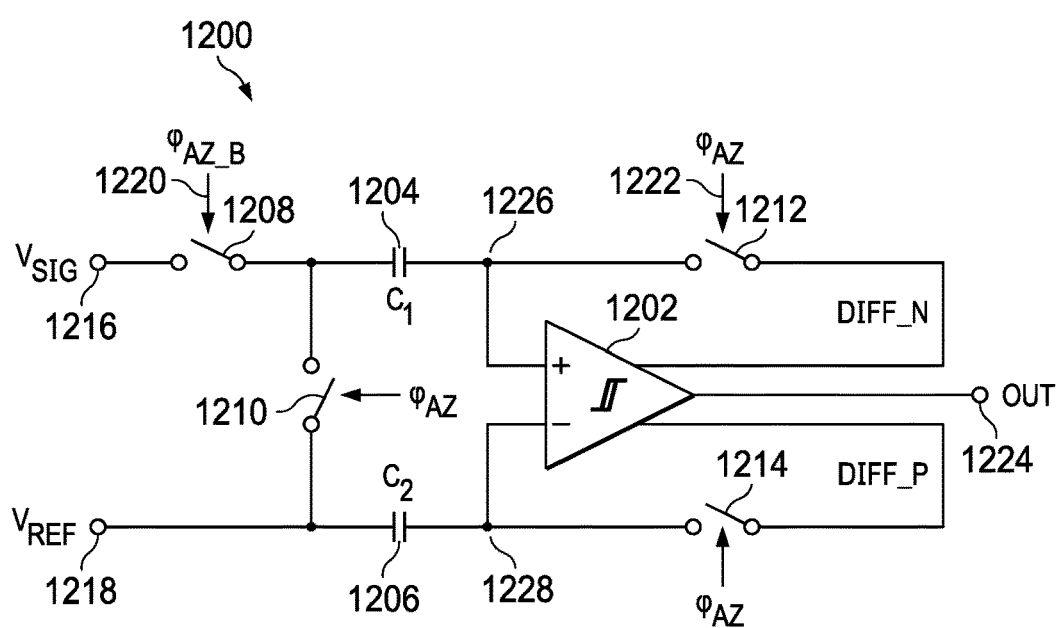
FIG. 12 is a schematic illustration of an example implementation of the comparator of FIG. 1 including a bootstrapped switch circuit.

FIG. 12 is a schematic illustration of an example comparator circuit 1200. The comparator circuit 1200 is an auto-zero comparator circuit. The comparator circuit 1200 includes an example comparator 1202, a first example capacitor ($C_1$) 1204, a second example capacitor ($C_2$) 1206, a first example switch 1208, a second example switch 1210, a third example switch 1212, and fourth example switch 1214. The comparator 1202 can be an example implementation of the comparator 110 of FIG. 1. The first switch 1208 and the second switch 1210 are N-type E-mode GaN transistors. The third switch 1212 and the fourth switch 1214 are example bootstrapped switch circuits represented by a switch. An example implementation of the third switch 1212 and/or the fourth switch 1214 is described below in connection with FIG. 15. Alternatively, the third switch 1212 and/or the fourth switch 1214 may be N-type E-mode GaN transistors.

In FIG. 12, a first signal (e.g., a voltage) ($V_{SIG}$) is coupled to a first example terminal 1216 of the comparator circuit 1200. $V_{SIG}$ can be representative of a voltage that is desired to be compared to a reference. For example, $V_{SIG}$ can correspond to $V_{SIG}$ of FIG. 1. A second signal (e.g., a voltage) ($V_{REF}$) is coupled to a second example terminal 1218 of the comparator circuit 1200. $V_{REF}$ can be representative of a reference voltage. For example, $V_{REF}$ can correspond to $V_{REF}$ in FIG. 1, which is at the second input of the comparator 110 of FIG. 1. The first switch 1208 is coupled to the first terminal 1216. The second switch 1210 and $C_2$ 1206 are coupled to the second terminal 1218.

$C_1$ 1204 is coupled to the first switch 1508, the second switch 1210, the third switch 1212, and a first input (designated with a '+' symbol) of the comparator 1202. $C_2$ 1206 is coupled to the second switch 1210, the fourth switch 1214, and a second input (designated with a '−' symbol) of the comparator 1202. $C_1$ 1204 is coupled to the first input of the comparator 1202 and the third switch 1212 at a first example node 1226. $C_2$ 1206 is coupled to the second input of the comparator 1202 and the fourth switch 1214 at a second example node 1228.

The third switch 1212 is coupled to a first differential output (DIFF_N) of the comparator 1202. The fourth switch 1214 is coupled to a second differential output (DIFF_P) of the comparator 1202. The comparator 1202 has an example output terminal (OUT) (e.g., a comparator output terminal) 1224. For example, the output terminal 1224 of FIG. 12 can correspond to the output of the comparator 110 of FIG. 1, which is coupled to the reset input of the second latch 144. In such examples, the output terminal 1224 of FIG. 12 can be coupled to the reset input of the second latch 144.

The first switch 1208 is controlled by a first example control signal ($\varphi_{AZ\_B}$) 1220. The second switch 1210, the third switch 1212, and the fourth switch 1214 are controlled by a second example control signal ($\varphi_{AZ}$) 1222. The first control signal 1220 is an enable signal that can be asserted while a main power transistor, such as $Q_S$ 148 of FIG. 1, is turned on. For example, the first control signal 1220 can be asserted in response to turning on $Q_S$ 148 and can be de-asserted in response to turning off $Q_S$ 148. Accordingly, the comparator 1202 can be active, enabled, etc., and/or otherwise executing a voltage comparison (e.g., comparing $V_{SIG}$ to $V_{REF}$) in response to $Q_S$ 148 being active and, thus, causing the first control signal 1220 to be asserted.

The second control signal 1222 can be asserted to invoke an auto-zero (AZ) operation of the comparator circuit 1200. The second control signal 1222 is an inverted enable signal provided by a pull-down path of a gate driver. For example, the second control signal 1222 can be asserted in response to turning off $Q_S$ 148 and can be de-asserted in response to turning on $Q_S$ 148. Accordingly, the comparator 1202 can be instructed to execute an auto-zero operation instead of a voltage comparison (e.g., comparing $V_{SIG}$ to $V_{REF}$) in response to $Q_S$ 148 being disabled and, thus, causing the first control signal 1220 to be asserted.

Advantageously, a general auto-zero loop is implemented around the differential stages (DIFF_N and DIFF_P) of the comparator circuit 1200 to reduce the input referred offset of the comparator circuit 1200. Advantageously, $C_1$ 1204 and $C_2$ 1206 are coupled to the comparator 1202 in an arrangement to extend the DC input common mode range to full rail-to-rail (e.g., from a ground terminal (GND) to a supply voltage terminal (VDD)).

In example operating conditions, the comparator circuit 1200 can be instructed and/or otherwise invoked to execute a comparison operation. For example, the first control signal 1220 can be asserted to close the first switch 1208 and the second control signal 1222 can be de-asserted to open the second through fourth switches 1210, 1212, 1214. In such examples, $V_{SIG}$ is stored on $C_1$ 1204 and $V_{REF}$ is stored on $C_2$ 1206. The comparator 1202 can compare $V_{SIG}$ to $V_{REF}$. In response to $V_{SIG}$ being greater than $V_{REF}$, the comparator 1202 asserts a logic high signal (e.g., 3.3 V, 5 V, etc.), at the output terminal 1224, otherwise the comparator 1202 generates a logic low signal (e.g., 0 V, 0.5 V, etc.) at the output terminal 1224.

In example operating conditions, the comparator circuit 1200 can be instructed and/or otherwise invoked to execute an auto-zero operation. For example, the first control signal 1220 can be de-asserted and the second control signal 1222 can be asserted. In such examples, the differential stages (DIFF_N and DIFF_P) are placed into a unity gain configuration by coupling the differential outputs to the corresponding inputs of the comparator 1202.

In response to invoking the auto-zero operation, a first voltage of DIFF_N becomes the same voltage at the first input of the comparator 1202, which can be stored on a first plate of $C_1$ 1204. For example, the first voltage can be a first drain voltage associated with a first transistor (e.g., $Q_4$ of FIG. 13). A second voltage of DIFF_P can be the same voltage at the second input of the comparator 1202, which can be stored on a first plate of $C_2$ 1206. For example, the second voltage can be a second drain voltage associated with a second transistor (e.g., $Q_3$ of FIG. 13). By closing the second switch 1210, $V_{REF}$ is transferred to second plates of $C_1$ 1204 and $C_2$ 1206. Accordingly, an offset voltage associated with the transistors, such as $Q_1$ 1312, $Q_2$ 1314, $Q_3$ 1344, and $Q_4$ 1346 of FIG. 13, can be sampled on $C_1$ 1204 and $C_2$ 1206. For example, if the first drain voltage associated with DIFF_N is higher than the second drain voltage associated with DIFF_P, then the voltage sampled on $C_1$ 1204 is greater than the voltage sampled on $C_2$ 1206.

In example operating conditions, in response to asserting the first control signal 1220 and de-asserting the second control signal 1222, $V_{SIG}$ or $V_{REF}$ can be level shifted based on the previously sampled offset voltage. For example, if a first input transistor associated with $V_{SIG}$ had a greater drain voltage than a drain voltage of a second input transistor associated with $V_{REF}$, then the sampled voltage stored on $C_2$ 1206 is greater than the sampled voltage stored on $C_1$ 1204. In such examples, $V_{REF}$ can be level shifted higher by an amount of the sampled voltage to eliminate and/or otherwise reduce an effect of the offset voltage of the input transistors on a subsequent comparison by the comparator 1202.

Figure 13:
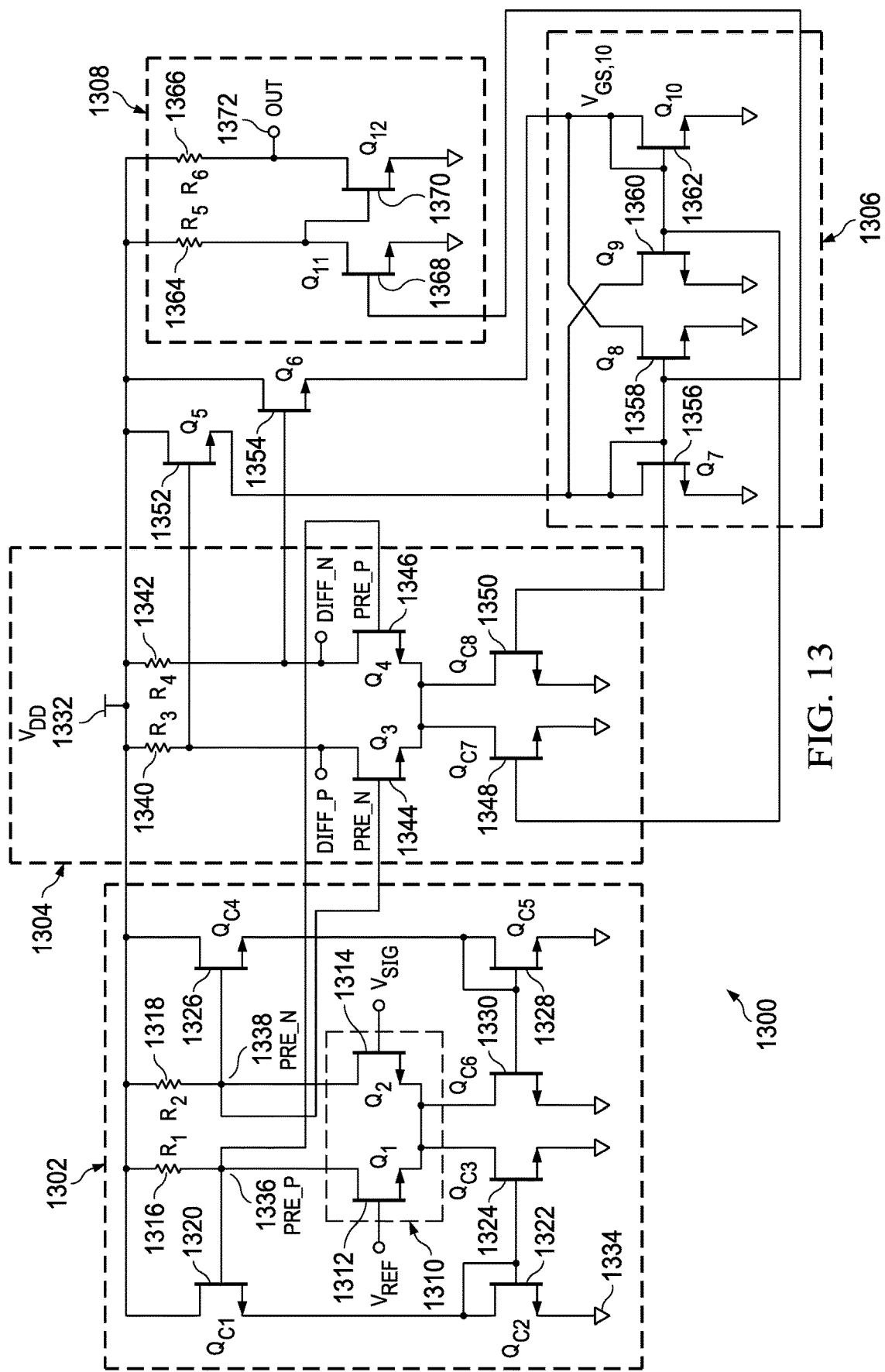
FIG. 13 is a schematic illustration of an example implementation of the comparator of FIGS. 1 and/or 12.

FIG. 13 is a schematic illustration of an example comparator 1300. The comparator 1300 of the example of FIG. 13 is a comparator circuit that can be an example implementation of the comparator 110 of FIG. 1 and/or the comparator 1202 of FIG. 12. The comparator 1300 includes a first example differential stage 1302, a second example differential stage 1304, an example cross-coupled latch 1306, and an example output stage 1308. The first differential stage 1302 is a first differential amplifier (e.g., a first differential amplifier circuit) and the second differential stage 1304 is a second differential amplifier (e.g., a second differential amplifier circuit). For example, the first differential amplifier stage 1302 and/or the second differential amplifier stage 1304 may implement the differential amplifier 1100 of FIG. 11.

The first differential stage 1302 includes an example input stage 1310, which includes a first example transistor ($Q_1$) 1312 and a second example transistor ($Q_2$) 1314. $Q_1$ 1312 and $Q_2$ 1314 are input transistors (e.g., input stage transistors). The input stage 1310 obtains signals (e.g., voltages) to compare, such as $V_{SIG}$ coupled to $Q_2$ 1314 and $V_{REF}$ (a reference voltage) coupled to $Q_1$ 1312.

The first differential stage 1302 includes a first example resistor ($R_1$) 1316, a second example resistor ($R_2$) 1318, a first example common mode transistor ($Q_{C1}$) 1320, a second example common mode transistor ($Q_{C2}$) 1322, a third example common mode transistor ($Q_{C3}$) 1324, a fourth example common mode transistor ($Q_{C4}$) 1326, a fifth example common mode transistor ($Q_{C5}$) 1328, and a sixth example common mode transistor ($Q_{C6}$) 1330. For example, $Q_{C1}$-$Q_{C6}$ 1320, 1322, 1324, 1326, 1328, 1330 are common mode transistors. In an example, $Q_1$ 1312, $Q_2$ 1314, $Q_{C1}$ 1320, $Q_{C2}$ 1322, $Q_{C3}$ 1324, $Q_{C4}$ 1326, $Q_{C5}$ 1328, and $Q_{C6}$ 1330 are N-type E-mode GaN transistors.

$R_1$ 1316, $R_2$ 1318, a drain (e.g., a current terminal, a drain terminal, etc.) of $Q_{C1}$ 1320, and a drain of $Q_{C4}$ 1326 are coupled to a supply voltage terminal ($V_{DD}$) 1332. A source of $Q_{C1}$ 1320 is coupled to a drain of $Q_{C2}$ 1322, to a gate of $Q_{C2}$ 1322, and to a gate (e.g., a gate terminal) of $Q_{C3}$ 1324. A source (e.g., a current terminal, a source terminal, etc.) of $Q_{C4}$ 1326 is coupled to a drain of $Q_{C5}$ 1328, to a gate of $Q_{C5}$ 1328, and to a gate of $Q_{C6}$ 1330. A source of $Q_1$ 1312 of coupled to a source of $Q_2$ 1314, to a drain of $Q_{C3}$ 1324, and to a drain of $Q_{C6}$ 1330. Sources of $Q_{C2}$ 1322, $Q_{C3}$ 1324, $Q_{C5}$ 1328, and $Q_{C6}$ 1330 are coupled to a reference terminal (e.g., a ground terminal) 1334. The first differential stage 1302 is coupled to the second differential stage 1304 via a first example node 1336 and a second example node 1338.

The second differential stage 1304 includes a third example resistor ($R_3$) 1340, a fourth example resistor ($R_4$) 1342, a third example transistor ($Q_3$) 1344, a fourth example transistor ($Q_4$) 1346, a seventh example common mode transistor ($Q_{C7}$) 1348, and an eighth example common mode transistor ($Q_{C8}$) 1350. In an example, $Q_3$ 1344, $Q_4$ 1346, $Q_{C7}$ 1348, and $Q_{C8}$ 1350 are N-type E-mode GaN transistors.

$Q_{C1}$ through $Q_{C8}$ 1320, 1322, 1324, 1326, 1328, 1330, 1348, 1350 are used in common mode feedback loops. For example, $Q_{C1}$-$Q_{C6}$ 1320, 1322, 1324, 1326, 1328, 1330 are coupled in an arrangement to establish a common mode loop (e.g., a common mode feedback loop) to adjust current flowing through $Q_1$ 1312 and $Q_2$ 1314 in order to set a proper common mode voltage at the drains of $Q_1$ 1312 and $Q_2$ 1314 to achieve a desired common mode. $Q_{C7}$ 1348 and $Q_{C8}$ 1350 are coupled in an arrangement to establish a common mode loop to set the currents through $Q_3$ 1344 and $Q_4$ 1346 to have the proper common mode voltage at the drains of $Q_3$ 1344 and $Q_4$ 1346.

$R_3$ 1340 and $R_4$ 1342 are coupled to $V_{DD}$ 1332. A drain of $Q_3$ 1344 is coupled to $R_3$ 1340. A drain of $Q_4$ 1346 is coupled to $R_4$ 1342. A source of $Q_3$ 1344 is coupled to a source of $Q_4$ 1346, to a drain of $Q_{C7}$ 1348, and to a drain of $Q_{C8}$ 1350. Sources of $Q_{C7}$ 1348 and $Q_{C8}$ 1350 are coupled to the reference terminal 1334. The first node 1336 is coupled to a gate of $Q_4$ 1346 to deliver and/or otherwise transfer the signal PRE_P from the first differential stage 1302 to the second differential stage 1304. The second node 1338 is coupled to a gate of $Q_3$ 1344 to deliver and/or otherwise transfer the signal PRE_N from the first differential stage 1302 to the second differential stage 1304.

The second differential stage 1304 is coupled to the cross-coupled latch 1306. The gate of $Q_{C8}$ 1350 is coupled to the gates of $Q_7$ 1356 and $Q_8$ 1358. The gate of $Q_{C7}$ 1348 is coupled to the gates of $Q_9$ 1360 and $Q_{10}$ 1362, the drain of $Q_{10}$ 1362, and the drain of $Q_8$ 1358.

The cross-coupled latch 1306 includes a seventh example transistor ($Q_7$) 1356, an eighth example transistor ($Q_8$) 1358, a ninth example transistor ($Q_9$) 1360, and a tenth example transistor ($Q_{10}$) 1362. In an example, $Q_7$ 1356, $Q_8$ 1358, $Q_9$ 1360, and $Q_{10}$ 1362 are N-type E-mode GaN transistors. A drain of $Q_7$ 1356 is coupled to a source of $Q_5$ 1352, to a gate of $Q_7$ 1356, to a gate of $Q_8$ 1358, and to a drain of $Q_9$ 1360. A drain of $Q_8$ 1358 is coupled to a source of $Q_6$ 1354, to a drain of $Q_{10}$ 1362, to a gate of $Q_{10}$ 1362, to a gate of $Q_9$ 1360, and to a gate of $Q_{C7}$ 1348. A gate of $Q_9$ 1360 is coupled to the gate of $Q_{10}$ 1362. Sources of $Q_7$ 1356, $Q_8$ 1358, $Q_9$ 1360, and $Q_{10}$ 1362 are coupled to the reference terminal 1334.

The second differential stage 1304 is coupled to a fifth example transistor ($Q_5$) 1352 and a sixth example transistor ($Q_6$) 1354. In some examples, the second differential stage 1304 includes $Q_5$ 1352 and $Q_6$ 1354. For example, $Q_5$ 1352, $Q_6$ 1354, $Q_7$ 1356, $Q_{10}$ 1362, $Q_{C7}$ 1348, and $Q_{C8}$ 1350 are coupled together in an arrangement to form a common mode feedback loop for the second differential stage 1304. In such examples, $Q_5$ 1352 can operate similarly to $Q_{C1}$ 1320, $Q_6$ 1354 can operate similarly to $Q_{C4}$ 1326, $Q_7$ 1356 can operate similarly to $Q_{C2}$ 1322, $Q_{10}$ 1362 can operate similarly to $Q_{C5}$ 1328, $Q_{C7}$ 1348 can operate similarly to $Q_{C3}$ 1324, and $Q_{C8}$ 1350 can operate similarly to $Q_{C6}$ 1330. $R_3$ 1340 and the drain of $Q_3$ 1344 are coupled to a gate of $Q_5$ 1352. $R_4$ 1342 and the drain of $Q_4$ 1346 are coupled to a gate of $Q_6$ 1354. Drains of $Q_5$ 1352 and $Q_6$ 1354 are coupled to $V_{DD}$ 1332. In an example, $Q_5$ 1352 and $Q_6$ 1354 are N-type E-mode GaN transistors. The output stage 1308 includes a fifth example resistor ($R_5$) 1364, a sixth example resistor ($R_6$) 1366, an eleventh example transistor ($Q_{11}$) 1368, and a twelfth example transistor ($Q_{12}$) 1370. $Q_{11}$ 1368 and $Q_{12}$ 1370 are N-type E-mode GaN transistors. $R_5$ 1364 and $R_6$ 1366 are coupled to $V_{DD}$ 1332. A drain of $Q_{11}$ 1368 is coupled to $R_5$ 1364 and a gate of $Q_{12}$ 1370. A drain of $Q_{12}$ 1370 is coupled to $R_6$ 1366 and an example output terminal (OUT) 1372. For example, the output terminal 1372 of FIG. 13 can correspond to the output terminal 1224 of FIG. 12.

The comparator 1300 includes the first differential stage 1302 to increase a gain of a voltage difference between $V_{SIG}$ and $V_{REF}$ at the input stage 1310. The first differential stage 1302 generates first example amplified signals PRE_P and PRE_N. For example, in response to $V_{SIG}$ being greater than $V_{REF}$, $Q_2$ 1314 is turned on harder (e.g., conducts more current) than $Q_1$ 1312, which causes PRE_N to decrease (and PRE_P to increase). In response to PRE_N decreasing, $Q_4$ 1346 turns on harder than $Q_3$ 1344, which causes DIFF_P to increase (and DIFF_N to decrease). In other examples, in response to $V_{SIG}$ being less than $V_{REF}$, PRE_P decreases in voltage and turns on $Q_3$ 1344 harder than $Q_4$ 1346 to cause DIFF_N to increase in voltage.

The comparator 1300 includes the second differential stage 1304 to increase the gain of the auto-zero loop, such as the auto-zero loop depicted in FIG. 12. For example, the second differential stage 1304 can increase the gain of the voltage difference between $V_{SIG}$ and $V_{REF}$ generated by the first differential stage 1302. $Q_5$ 1352 and $Q_6$ 1354 act and/or otherwise operate as source followers to feed the signal from the second differential stage 1304 to the cross-coupled latch 1306 for improved gain and to add a hysteresis. The gate-to-source voltage ($V_{GS}$) of $Q_7$ 1356 and $Q_{10}$ 1362 is used as bias voltage for the current source devices $Q_{C8}$ 1350 and $Q_{C7}$ 1348, respectively. Depending on the differential input signal, either $Q_{C7}$ 1348 or $Q_{C8}$ 1350 can deliver the bias current for the second differential stage 1304.

$Q_5$ 1352 and $Q_6$ 1354 are source followers. For example, the voltage at the source of $Q_5$ 1352 follow the voltage at the gate of $Q_5$ 1352 shifted by the threshold voltage of $Q_5$ 1352. In other examples, the voltage at the source of $Q_6$ 1354 follow the voltage at the gate of $Q_6$ 1354 shifted by the threshold voltage of $Q_6$ 1354. In example operating conditions, in response to $V_{SIG}$ being greater than $V_{REF}$ and causing $Q_4$ 1346 to turn on harder than $Q_3$ 1344, DIFF_P increases in voltage to increase the voltage at the gate of $Q_5$ 1352 and, thus, increase the voltage at the source of $Q_5$ 1352.

In example operating conditions, $Q_{C7}$ 1356, $Q_9$ 1360, and $Q_{10}$ 1362 are turned off because they have their gates connected together and their sources are connected to the reference terminal 1334. In such example operating conditions, $V_{GS}$ of $Q_{C7}$ 1356, $Q_9$ 1360, and $Q_{10}$ 1362 can be 1.5 V, which is less than a $V_{GS,TH}$ of approximately 2 V for respective ones of $Q_{C7}$ 1356, $Q_9$ 1360, and $Q_{10}$ 1362.

In example operating conditions, $Q_{C8}$ 1350, $Q_7$ 1356, $Q_8$ 1358, and $Q_{11}$ 1368 are turned on because they have their gates connected together and their sources are connected to the reference terminal 1334. In such example operating conditions, $V_{GS}$ of $Q_{C8}$ 1350, $Q_7$ 1356, $Q_8$ 1358, and $Q_{11}$ 1368 can be 2.5 V, which is greater than a $V_{GS,TH}$ of approximately 2 V for respective ones of $Q_{C7}$ 1356, $Q_9$ 1360, and $Q_{10}$ 1362. In response to $Q_{11}$ 1368 being turned on, the gate of $Q_{12}$ 1370 is pulled to the reference terminal 1334 and, thereby, causing $Q_{12}$ 1370 to turn off. In response to turning off $Q_{12}$ 1370, the voltage at the output terminal 1372 goes high. In such example operating conditions, in response to $Q_{C7}$ 1348 being turned off and $Q_{C8}$ 1350 being turned on, only $Q_{C8}$ 1350 delivers the bias current for the second differential stage 1304.

Figure 14:
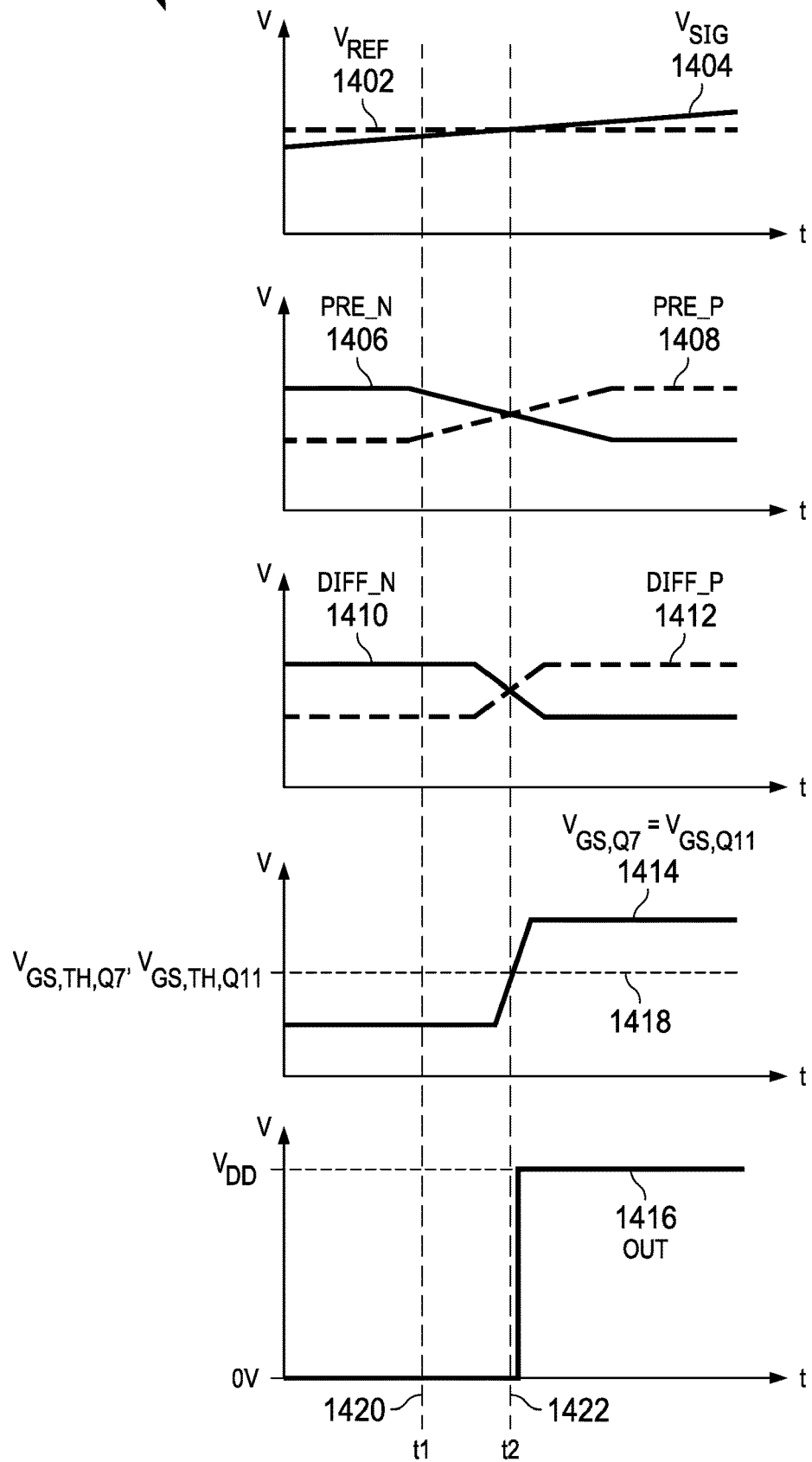
FIG. 14 depicts graphs including example waveforms associated with the comparator of FIGS. 1, 12, and/or 13.

FIG. 14 depicts graphs including example waveforms 1402, 1404, 1406, 1408, 1410, 1412, 1414, 1416 associated with the comparator 110 of FIG. 1, the comparator 1202 of FIG. 12, and/or the comparator 1300 of FIG. 13. The waveforms 1402, 1404, 1406, 1408, 1410, 1412, 1414, 1416 include a first example waveform 1402, a second example waveform 1404, a third example waveform 1406, a fourth example waveform 1408, a fifth example waveform 1410, a sixth example waveform 1412, a seventh example waveform 1414, and an eighth example waveform 1416. Further depicted is an example voltage level ($V_{GS,TH,Q7}$, $V_{GS,TH,Q11}$) 1418 corresponding to a threshold voltage of $Q_7$ 1356 and $Q_{11}$ 1368 of FIG. 13.

The first waveform 1402 is a waveform of a reference voltage that can correspond to $V_{REF}$ of FIGS. 1, 12, 13, and/or 14. The second waveform 1404 is a waveform of a signal voltage that can correspond to $V_{SIG}$ of FIGS. 1, 12, 13, and/or 14. The third waveform 1406 is a waveform of a voltage that can correspond to PRE_N of FIG. 13. The fourth waveform 1408 is a waveform of a voltage that can correspond to PRE_P of FIG. 13. The fifth waveform 1410 is a waveform of a voltage that can correspond to DIFF_N of FIGS. 12 and/or 13. The sixth example waveform 1412 is a waveform of a voltage that can correspond to DIFF_P of FIGS. 12 and/or 13. The seventh example waveform 1414 is a waveform of a gate-to-source voltage that can correspond to the gate-to-source voltages ($V_{GS,TH,Q7}$, $V_{GS,TH,Q11}$) of $Q_7$ 1356 and $Q_{11}$ 1368 of FIG. 13. The eighth example waveform 1416 is a waveform of a comparator output voltage that can correspond to an output of the comparator 110 of FIG. 1, a voltage at the output terminal 1224 of FIG. 12, and/or a voltage at the output terminal 1372 of FIG. 13.

At a first example time (t1) 1420, $V_{SIG}$ is less than $V_{REF}$, which causes PRE_N to be greater than PRE_P and DIFF_N to be greater than DIFF_P. For example, in response to $V_{SIG}$ being less than $V_{REF}$, $Q_1$ 1312 of FIG. 13 is turned on harder than $Q_2$ 1314, which causes PRE_N to increase in voltage and PRE_P to decrease in voltage. In such examples, in response to PRE_N being greater than PRE_P, $Q_3$ 1344 is turned on harder than $Q_4$ 1346, which causes DIFF_N to be greater than DIFF_P. At the first time 1420, $V_{GS,Q7}$ and $V_{GS,Q11}$ are less than the threshold voltage 1418, which causes $Q_7$ 1356 and $Q_{11}$ 1368 of FIG. 13 to turn off. When $Q_{11}$ 1368 is turned off, the gate of $Q_{12}$ 1370 is pulled up to $V_{DD}$ 1332 by $R_5$ 1364, which causes $Q_{12}$ 1370 to turn on and pull down the output signal at the output terminal 1372 of the comparator 1300 to a logic low level (e.g., 0 V).

At a second example time (t2) 1422, $V_{SIG}$ is approximately equal to $V_{REF}$. After a relatively short time after the second time 1422, $V_{SIG}$ is greater than $V_{REF}$, which causes PRE_P to be greater than PRE_N and DIFF_P to be greater than DIFF_N. For example, in response to $V_{SIG}$ being greater than $V_{REF}$, $Q_2$ 1314 of FIG. 13 is turned on harder than $Q_1$ 1312, which causes PRE_P to increase in voltage and PRE_N to decrease in voltage. In such examples, in response to PRE_P being greater than PRE_N, $Q_4$ 1346 is turned on harder than $Q_3$ 1344, which causes DIFF_P to be greater than DIFF_N. After the second time 1422, $V_{GS,Q7}$ and $V_{GS,Q11}$ are greater than the threshold voltage 1418, which causes $Q_7$ 1356 and $Q_{11}$ 1368 of FIG. 13 to turn on. When $Q_{11}$ 1368 is turned on, $Q_{11}$ 1368 pulls down the gate of $Q_{12}$ 1370 to turn off $Q_{12}$ 1370. Thereby, the output signal at the output terminal 1372 of the comparator 1300 is pulled up to $V_{DD}$ 1332 by $R_6$ 1366 to a logic high level.

Figure 15:
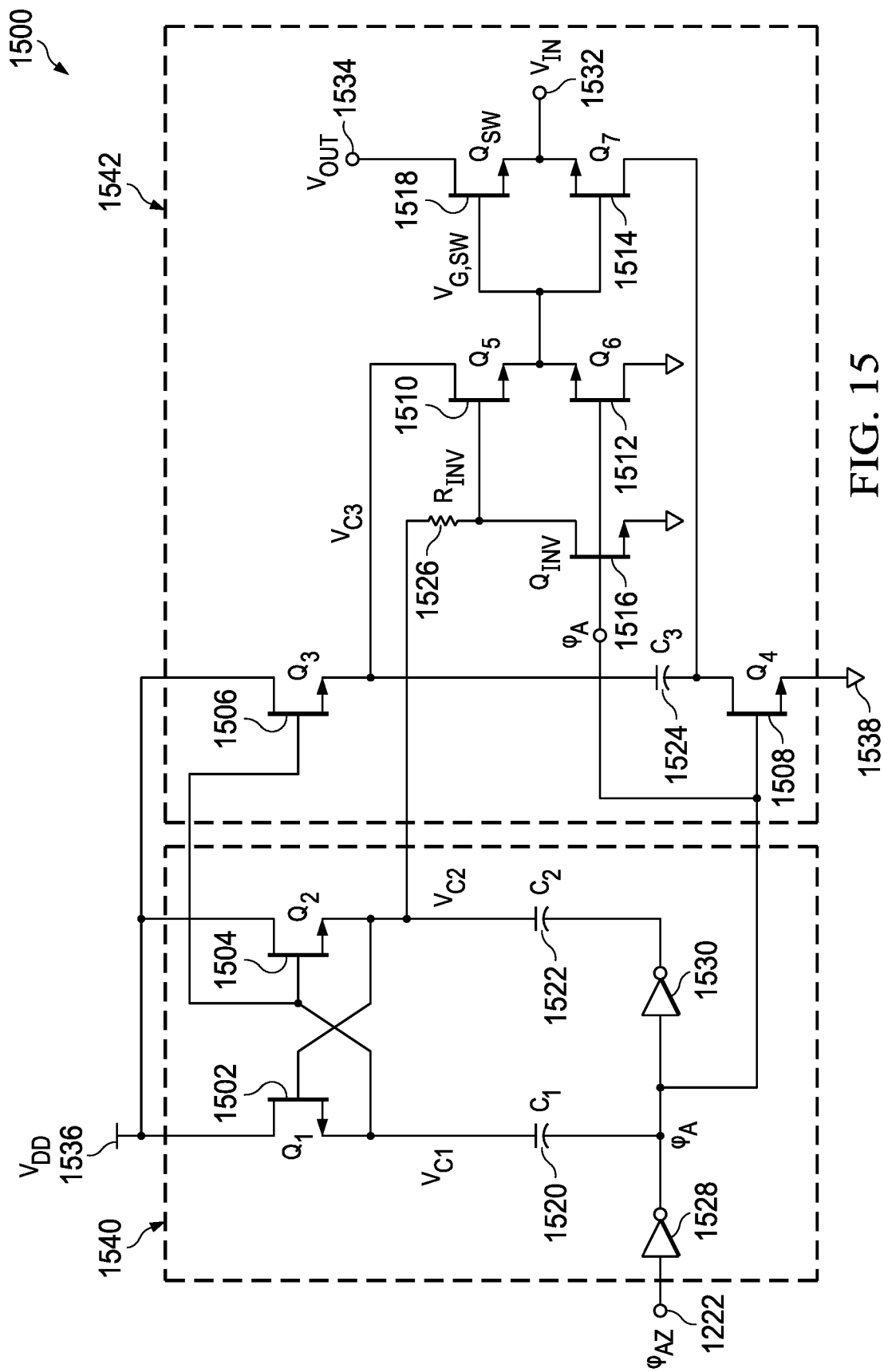
FIG. 15 is a schematic illustration of an example implementation of the bootstrapped switch circuit of FIG. 12.

FIG. 15 is a schematic illustration of an example bootstrapped switch circuit 1500. The bootstrapped switch circuit 1500 of FIG. 15 is an example implementation of the third switch 1212 and/or the fourth switch 1214 of FIG. 12. Advantageously, the bootstrapped switch circuit 1500 is operable to put the comparator circuit 1200 of FIG. 12 in a unity-gain configuration for auto-zeroing without P-type devices (e.g., P-type transistors). Advantageously, the bootstrapped switch circuit 1500 can provide well-matched switch resistance for the feedback paths depicted in FIG. 12 (e.g., a feedback path from DIFF_N to the third switch 1212 to $C_1$ 1204 of FIG. 12).

The bootstrapped switch circuit 1500 includes a first example transistor ($Q_1$) 1502, a second example transistor ($Q_2$) 1504, a third example transistor ($Q_3$) 1506, a fourth example transistor ($Q_4$) 1508, a fifth example transistor ($Q_5$) 1510, a sixth example transistor ($Q_6$) 1512, a seventh example transistor ($Q_7$) 1514, an eighth example transistor ($Q_{INV}$) 1516, a ninth example transistor ($Q_{SW}$) 1518, a first example capacitor ($C_1$) 1520, a second example capacitor ($C_2$) 1522, a third example capacitor ($C_3$) 1524, an example resistor ($R_{INV}$) 1526, a first example logic gate 1528, a second example logic gate 1530, an example input voltage terminal 1532 and an example output voltage terminal 1534. Further depicted in FIG. 15 is an example supply voltage terminal ($V_{DD}$) 1536 and an example reference voltage terminal (e.g., a ground terminal) 1538. $Q_1$ 1502, $Q_2$ 1504, $Q_3$ 1506, $Q_4$ 1508, $Q_5$ 1510, $Q_6$ 1512, $Q_7$ 1514, $Q_{INV}$ 1516, and $Q_{SW}$ 1518 are N-type E-mode GaN transistors. The first logic gate 1528 and the second logic gate 1530 are inverters (e.g., inverter logic gates).

The bootstrapped switch circuit 1500 includes an example charge pump 1540 and an example bootstrapping circuit 1542. The charge pump 1540 is a cross-coupled charge pump. The charge pump 1540 includes $Q_1$ 1502, $Q_2$ 1504, $C_1$ 1520, $C_2$ 1522, the first logic gate 1528 and the second logic gate 1530. The bootstrapping circuit 1542 includes $Q_3$ 1506, $Q_4$ 1508, $Q_5$ 1510, $Q_6$ 1512, $Q_7$ 1514, $Q_{INV}$ 1516, $Q_{SW}$ 1518, $C_3$ 1524, and the resistor 1526.

In some examples where the third switch 1212 of FIG. 12 is implemented by the bootstrapped switch circuit 1500, the input voltage terminal 1532 is coupled to the DIFF_N output of the comparator 1202. In such examples, the output voltage terminal 1534 can be coupled to the first node 1226 of FIG. 12. In some such examples, $Q_{SW}$ 1518 can correspond to the third switch 1212.

In some examples where the fourth switch 1214 of FIG. 12 is implemented by the bootstrapped switch circuit 1500, the input voltage terminal 1532 is coupled to the DIFF_P output of the comparator 1202. In such examples, the output voltage terminal 1534 can be coupled to the second node 1228 of FIG. 12. In some such examples, $Q_{SW}$ 1518 can correspond to the fourth switch 1214.

Drains of $Q_1$ 1502, $Q_2$ 1504, and $Q_3$ 1506 are coupled to $V_{DD}$ 1536. A source of $Q_1$ 1502 is coupled to $C_1$ 1520, a gate of $Q_2$ 1504 and a gate of $Q_3$ 1506. A source of $Q_2$ 1504 is coupled to a gate of $Q_1$ 1502, $C_2$ 1522, and the resistor 1526. A source of $Q_3$ 1506 is coupled to $C_3$ 1524 and a drain of $Q_5$ 1510. A drain of $Q_{INV}$ 1516 is coupled to the resistor 1526 and a gate of $Q_5$ 1510. A source of $Q_5$ 1510 is coupled to a drain of $Q_6$ 1512 and respective gates of $Q_7$ 1514 and $Q_{SW}$ 1518. A drain of $Q_4$ 1508 is coupled to $C_3$ 1524 and a drain of $Q_7$ 1514. A source of $Q_7$ 1514 and a drain of $Q_{SW}$ 1518 is coupled to the input voltage terminal 1532. A drain of $Q_{SW}$ 1518 is coupled to the output voltage terminal 1534.

An input terminal of the first logic gate 1528 is coupled to a first signal input that is configured to obtain a first control signal, which in the example of FIG. 15, is the second control signal 1222 of FIG. 12. An output terminal of the first logic gate 1528 is coupled to $C_1$ 1520, an input terminal of the second logic gate 1530, and respective gates of $Q_4$ 1508, $Q_{INV}$ 1516, and $Q_6$ 1512. An output terminal of the second logic gate 1530 is coupled to $C_2$ 1522. The first logic gate 1528 is configured to invert the first control signal to a second control signal ($\varphi_A$).

In example operating conditions, such as when the comparator 1202 of FIG. 12 is in normal operation and/or otherwise executing a comparison operation of $V_{SIG}$ and $V_{REF}$, $V_{DD}$ 1536 is stored on $C_3$ 1524. In example operating conditions, such as when the comparator 1202 of FIG. 12 is in auto-zero operation and/or otherwise executing an auto-zero operation, an input voltage ($V_{IN}$) at the input voltage terminal 1532 is coupled to a second plate of $C_3$ 1524 and the drain of $Q_4$ 1508. In response to coupling the input voltage terminal 1532 to the second plate of $C_3$ 1524, a voltage sum of $V_{DD}$ and $V_{IN}$ is delivered and/or otherwise guided to $Q_{SW}$ 1518 to provide a constant gate-to-source voltage of $V_{DD}$ independent of $V_{IN}$. In example operating conditions, the charge pump 1540 provides and/or otherwise delivers a voltage of $2*V_{DD}$ 1536 to the gate of $Q_3$ 1506 to charge $C_3$ 1524 to $V_{DD}$ 1536 and to apply the voltage sum (i.e., $V_{DD}+V_{IN}$) to the gate of $Q_{SW}$ 1518 via $Q_5$ 1510. Advantageously, the bootstrapping circuit 1542 includes $Q_{SW}$ 1518 coupled in an arrangement that is suitable for input voltages in a range of 0 to $V_{DD}$ 1536.

FIG. 16 depicts graphs including example waveforms 1602, 1604, 1606, 1608, 1610, 1612 associated with the third switch 1212 of FIG. 12, the fourth switch 1214 of FIG. 12, and/or the bootstrapped switch circuit 1500 of FIG. 15 during initialization or startup. The waveforms 1602, 1604, 1606, 1608, 1610, 1612 include a first example waveform 1602, a second example waveform 1604, a third example waveform 1606, a fourth example waveform 1608, a fifth example waveform 1610, and a sixth example waveform 1612.

The first waveform 1602 is a waveform of a supply voltage terminal, such as $V_{DD}$ 1536 of FIG. 15. For example, $V_{DD}$ in FIG. 16 can have a range of 0 V to 6 V. The second waveform 1604 is a waveform of a voltage of a control signal, such as the second control signal of FIG. 15. The third waveform 1606 is a waveform of a voltage of a control signal, such as the first control signal 1220 of FIGS. 12 and/or 15. The fourth waveform 1608 is a waveform of a voltage, such as $V_{C1}$ of FIG. 15. The fifth waveform 1610 is a waveform of a voltage, such as $V_{C2}$ of FIG. 15. The sixth waveform 1612 is a waveform of a voltage, such as $V_{C3}$ of FIG. 15.

FIG. 17 is an example timing diagram 1700 associated with the third switch 1212 of FIG. 12, the fourth switch 1214 of FIG. 12, and/or the bootstrapped switch circuit 1500 of FIG. 15. The timing diagram 1700 includes example waveforms 1702, 1704, 1706, 1708, 1710, 1712, 1714, 1716, 1718 including a first example waveform 1702, a second example waveform 1704, a third example waveform 1706, a fourth example waveform 1708, a fifth example waveform 1710, a sixth example waveform 1712, a seventh example waveform 1714, an eighth example waveform 1716, and a ninth example waveform 1718.

The first waveform 1702 is a waveform of a supply voltage terminal, such as $V_{DD}$ 1536 of FIG. 15. For example, the first waveform 1702 of FIG. 17 can correspond to the first waveform 1602 of FIG. 16. The second waveform 1704 is a waveform of a voltage of a control signal, such as the second control signal of FIG. 15. For example, the second waveform 1704 of FIG. 17 can correspond to the second waveform 1604 of FIG. 16. The third waveform 1706 is a waveform of a voltage of a control signal, such as the first control signal 1220 of FIGS. 12 and/or 15. For example, the third waveform 1706 of FIG. 17 can correspond to the third waveform 1606 of FIG. 16. The fourth waveform 1708 is a waveform of a voltage, such as $V_{C1}$ of FIG. 15.

The fourth waveform 1708 of FIG. 17 can correspond to the fourth waveform 1608 of FIG. 16. The fifth waveform 1710 is a waveform of a voltage, such as $V_{C2}$ of FIG. 15. For example, the fifth waveform 1710 of FIG. 17 can correspond to the fifth waveform 1610 of FIG. 16. The sixth waveform 1712 is a waveform of a voltage, such as $V_{C3}$ of FIG. 15. For example, the sixth waveform 1712 of FIG. 17 can correspond to the sixth waveform 1612 of FIG. 16. The seventh waveform 1714 is a waveform of an input voltage, such as $V_{IN}$ of FIG. 15. The eighth waveform 1716 is a waveform of an output voltage, such as $V_{OUT}$ of FIG. 15. The ninth waveform 1718 is a waveform of a gate voltage of a transistor ($V_{G,SW}$), such as a voltage at the gate of $Q_{SW}$ 1518 of FIG. 15.

In the timing diagram 1700 of FIG. 17, at a first example time (t1) 1720, $\varphi_{AZ}$ transitions from a logic low to a logic high, which causes $\varphi_A$ to transition from a logic high to a logic low. For example, the comparator 110 of FIG. 1, the comparator 1202 of FIG. 12, and/or the comparator 1300 of FIG. 13 can execute an auto-zero operation by coupling the differential outputs (DIFF_N and DIFF_P) of the comparator 110, 1202, 1300 to the inputs of the comparator 110, 1202, 1300 at the first time 1720. In response to $\varphi_A$ transitioning to a logic low, $V_{C1}$ of FIG. 15 decreases from $2*V_{DD}$ 1536 to $V_{DD}$ 1536. In response to $\varphi_A$ transitioning to a logic low, the second logic gate 1530 inverts the logic low to a logic high, which causes $V_{C2}$ to increase from $V_{DD}$ 1536 to $2*V_{DD}$ 1536. In response to $\varphi_A$ transitioning to a logic low, $Q_4$ 1508 of FIG. 15 is turned off, which causes $V_{C3}$ to increase. In response to $\varphi_A$ transitioning to a logic low, an inverter implemented by $Q_{INV}$ 1516 and $R_{INV}$ 1526 of FIG. 15 inverts the logic low to a logic high to turn on $Q_5$ 1510, which causes the gate voltage of $Q_{SW}$ 1518 ($V_{G,SW}$) to increase. In response to $V_{G,SW}$ increasing, $Q_{SW}$ 1518 of FIG. 15 turns on to transfer $V_{IN}$ from the input voltage terminal 1532 as $V_{OUT}$ at the output voltage terminal 1534 to execute the auto-zero operation.

In the timing diagram 1700 of FIG. 17, at a second example time (t2) 1722, $\varphi_{AZ}$ transitions from a logic high to a logic low, which causes $\varphi_A$ to transition from a logic low to a logic high. For example, the comparator 110 of FIG. 1, the comparator 1202 of FIG. 12, and/or the comparator 1300 of FIG. 13 can execute a comparison of $V_{SIG}$ and $V_{REF}$ at the second time 1722. At the second time 1722, when $\varphi_{AZ}$ is low, $C_3$ 1524 of FIG. 15 is recharged to $V_{DD}$ 1536 in response to turning on $Q_3$ 1506 and $Q_4$ 1508 of FIG. 15. In response to $\varphi_A$ transitioning to a logic high, $V_{C1}$ of FIG. 15 increases from $V_{DD}$ 1536 to $2*V_{DD}$ 1536. In response to $\varphi_A$ transitioning to a logic high, the second logic gate 1530 inverts the logic high to a logic low, which causes $V_{C2}$ to decrease from $2*V_{DD}$ 1536 to $V_{DD}$ 1536. In response to $\varphi_A$ transitioning to a logic high, $Q_4$ 1508 of FIG. 15 is turned on, which causes $V_{C3}$ to decrease. In response to $\varphi_A$ transitioning to a logic high, the inverter implemented by $Q_{INV}$ 1516 and $R_{INV}$ 1526 of FIG. 15 inverts the logic high to a logic low to turn off $Q_5$ 1510, which causes the gate voltage of $Q_{SW}$ 1518 ($V_{G,SW}$) to decease. In response to $V_{G,SW}$ decreasing, $Q_{SW}$ 1518 of FIG. 15 turns off and, thus, enabling the comparator 110 of FIG. 1, the comparator 1202 of FIG. 12, and/or the comparator 1300 of FIG. 13 to compare $V_{SIG}$ to $V_{REF}$ with reduced and/or otherwise eliminated offset voltage.

Figure 18:
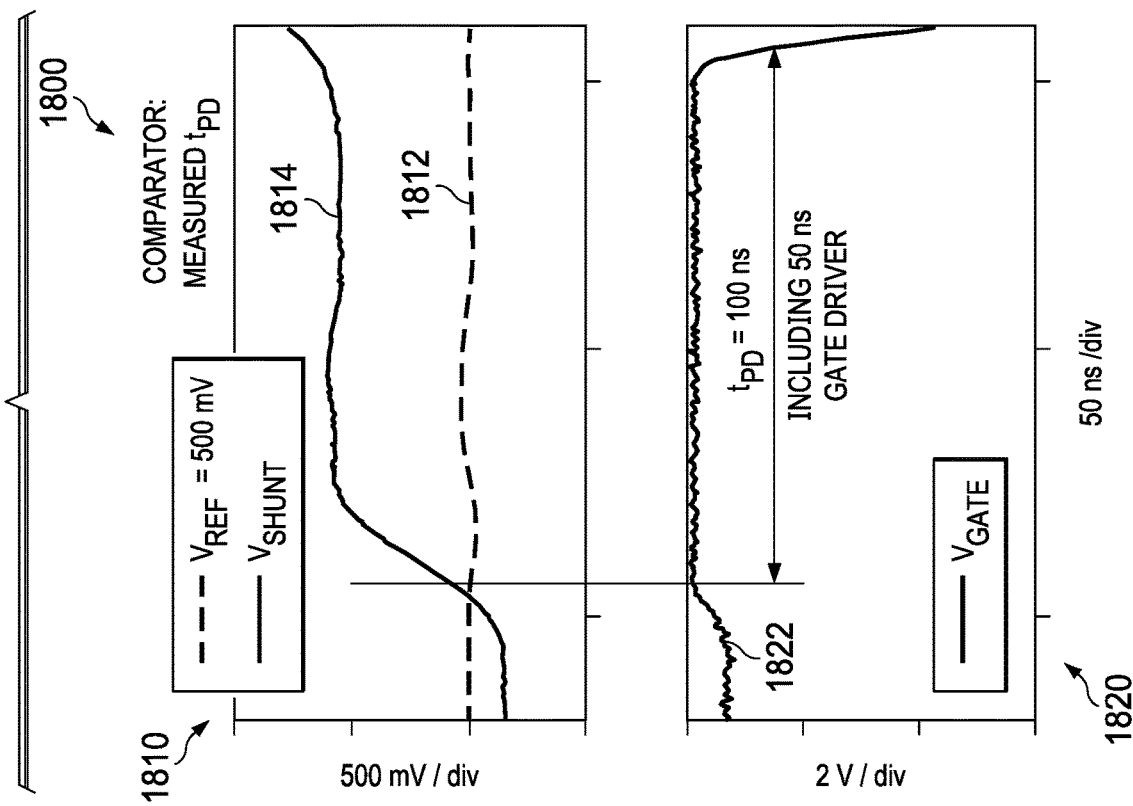
FIG. 18 depicts graphs of example propagation delays associated with the comparator of FIGS. 1, 12, and/or 13.

FIG. 18 depicts graphs 1810, 1820 of example measurements 1800 associated with the comparator 110 of FIG. 1, the comparator 1202 of FIG. 12, and/or the comparator 1300 of FIG. 13. The graphs 1810, 1820 include a first example graph 1810 and a second example graph 1820. The first graph 1810 includes a first example waveform 1812 and a second example waveform 1814. The first waveform 1812 is a waveform of a reference voltage, such as $V_{REF}$ of FIGS. 1, 12, 13, and/or 14. The second waveform 1814 is a waveform of a signal voltage, such as $V_{SHUNT}$ of FIG. 1. The second graph 1820 includes a third example waveform 1822, which is a waveform of a gate driver output, which can correspond to an output of the gate driver 108 of FIG. 1, such as $V_{GATE}$ of FIG. 1.

The measurements 1800 characterize the propagation delay associated with the comparator 110 of FIG. 1, the comparator 1202 of FIG. 12, and/or the comparator 1300 of FIG. 13 by relatively quickly stepping up $V_{SHUNT}$ by approximately 700 millivolts (mV) to 1.1 V, which is below the threshold voltage of the input transistors (e.g., $Q_1$ 1312 and $Q_2$ 1314 of FIG. 13) of the comparator 110, 1202, 1300. As depicted by the measurements 1800 of FIG. 18, approximately 100 nanoseconds (ns) after $V_{SHUNT}$ crosses $V_{REF}$, the output signal $V_{GATE}$ is pulled low. Subtracting the propagation delay of the gate driver (e.g., the gate driver 108), this results in an example propagation delay of the comparator 110, 1202, 1300 of approximately 50 ns, which affirms the input level shifting functionality of the auto-zeroing input capacitors (e.g., $C_1$ 1204 and $C_2$ 1206 of FIG. 12) of the comparator 110, 1202, 1300. Advantageously, the comparator 110 of FIG. 1, the comparator 1202 of FIG. 12, and/or the comparator 1300 of FIG. 13 have reliable switching at an example input common mode of 0.5 V<<$V_{TH}$, with the depicted propagation delays. A value of the propagation delay is dependent on temperature and/or otherwise correlates with a temperature coefficient of approximately 8000 parts-per-million per Kelvin of the on-resistance of the transistors and resistors in GaN technology.

Figure 19:
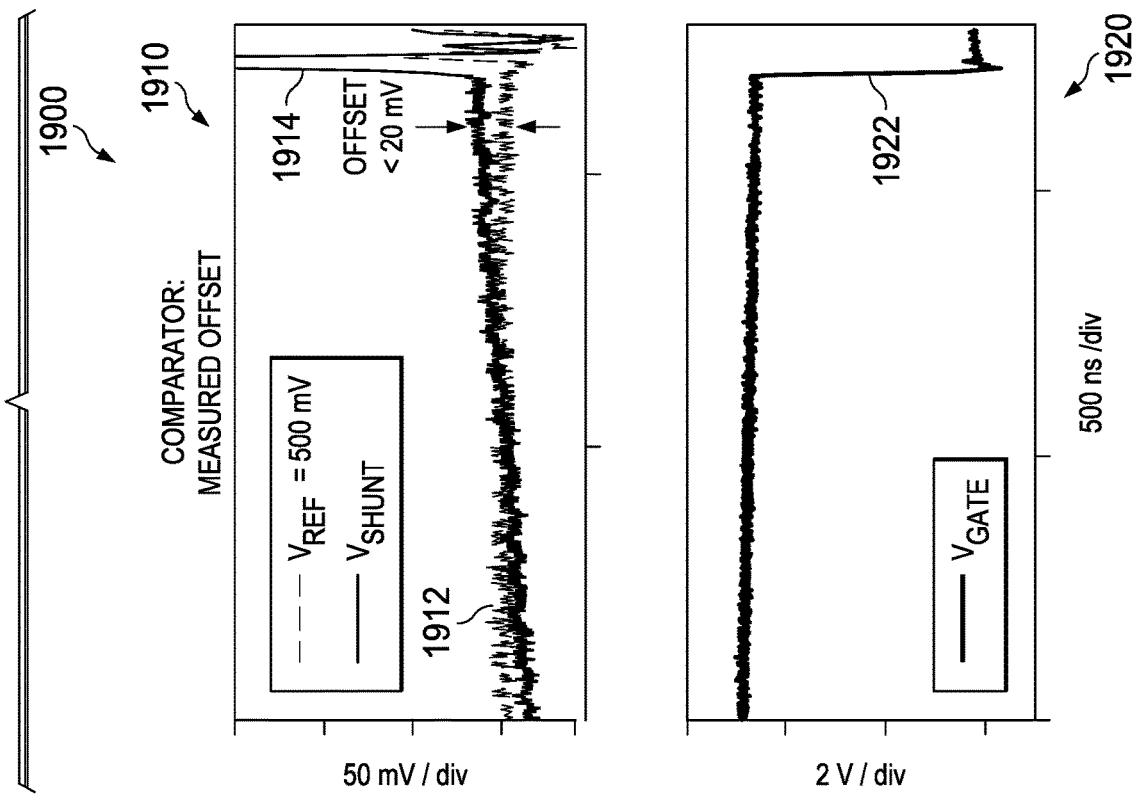
FIG. 19 depicts graphs of example measured offsets associated with the comparator of FIGS. 1, 12, and/or 13.

FIG. 19 depicts graphs 1910, 1920 of an example measurement 1900 associated with the comparator 110 of FIG.

1, the comparator 1202 of FIG. 12, and/or the comparator 1300 of FIG. 13. The graphs 1910, 1920 include a first example graph 1910 and a second example graph 1920. The first graph 1910 includes a first example waveform 1912 and a second example waveform 1914. The first waveform 1912 is a waveform of a reference voltage, such as $V_{REF}$ of FIGS. 1, 12, 13, and/or 14. The second waveform 1914 is a waveform of a signal voltage, such as $V_{SHUNT}$ of FIG. 1. The second graph 1920 includes a third example waveform 1922, which is a waveform of a gate driver output. The gate driver output can correspond to an output of the gate driver 108 of FIG. 1, such as $V_{GATE}$ of FIG. 1.

The offset reducing effect is depicted in the first graph 1910. For example, when the relatively slowly rising input voltage $V_{SHUNT}$ is approximately 18 mV higher than $V_{REF}$, the output signal $V_{GATE}$ is pulled low. Advantageously, the auto-zero loop depicted in FIG. 12 can reduce the input referred offset of the comparator 110, 1202, 1300 from an example typical value of 200 mV to less than 10%. Advantageously, the comparator 110 of FIG. 1, the comparator 1202 of FIG. 12, and/or the comparator 1300 of FIG. 13 demonstrates reliable switching at an example residual offset of 20 mV as depicted in the example graphs 1910, 1920 of FIG. 19.

Advantageously, by being implemented in E-mode GaN, the comparator 110 of FIG. 1, the comparator 1202 of FIG. 12, and/or the comparator 1300 of FIG. 13 is/are improvement(s) over conventional comparators. Advantageously, the comparator 110 of FIG. 1, the comparator 1202 of FIG. 12, and/or the comparator 1300 of FIG. 13 is/are improvement(s) because the auto-zero loop of FIG. 12 is implemented around the differential input stages of the comparator to reduce the input referred offset. Advantageously, the different configuration(s), coupling(s), etc., of the comparator 110 of FIG. 1, the comparator 1202 of FIG. 12, and/or the comparator 1300 of FIG. 13 is/are improvement(s) by being implemented using resistors and N-type devices, and not using any P-type devices.

Advantageously, the comparator 110 of FIG. 1, the comparator 1202 of FIG. 12, and/or the comparator 1300 of FIG. 13 is/are improvement(s) by not requiring additional biasing. Further, the comparator 110 of FIG. 1, the comparator 1202 of FIG. 12, and/or the comparator 1300 of FIG. 13 is/are improvement(s) because the input common mode is not limited to a voltage greater than $V_{TH}$. Advantageously, the comparator 110 of FIG. 1, the comparator 1202 of FIG. 12, and/or the comparator 1300 of FIG. 13 is/are improvement(s) by having a rail-to-rail logic output Advantageously, by being implemented using resistors and E-mode GaN devices, the bootstrapped switch circuit 1500 of FIG. 15 is an improvement over conventional bootstrapped switch circuits. Advantageously, the configuration(s), the coupling(s), etc., of the bootstrapped switch circuit 1500 of FIG. 15 is an improvement by not needing P-type devices. For example, the bootstrapped switch circuit 1500 of FIG. 15 is an improvement by being configured in such an arrangement to put the input stages of the comparator 110, 1202, 1300 in unity-gain configuration for auto-zeroing without P-type devices. Further, by effectuating the pull down of the gate of the switch transistor being implemented with only one transistor $Q_6$ 1512 in the bootstrapped switch circuit 1500 of FIG. 15, the bootstrapped switch circuit 1500 of FIG. 15 is an improvement because series connection of multiple transistors may not be required.

Figure 20:
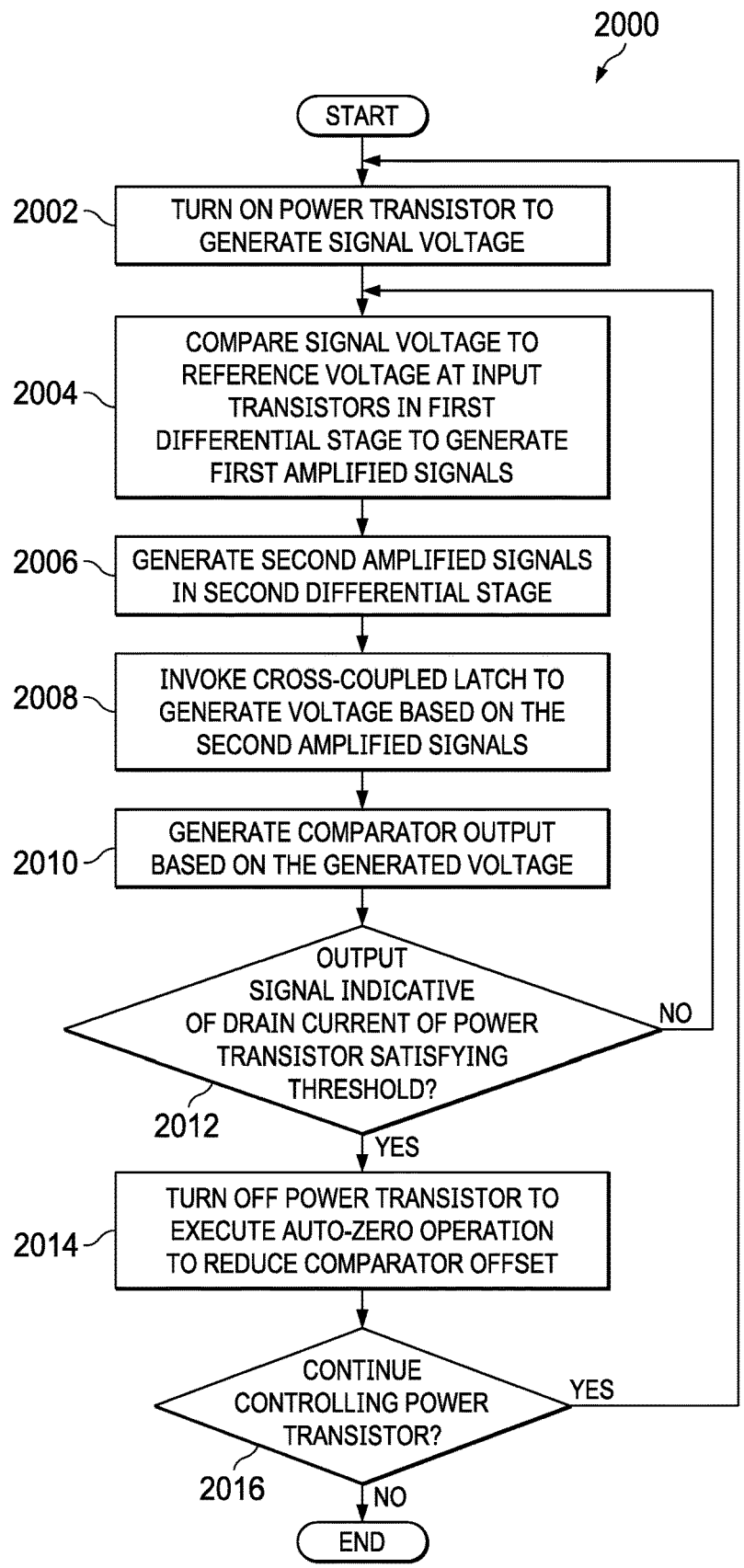
FIG. 20 is a flowchart representative of an example process that may be carried out while utilizing machine readable instructions that can be executed and/or hardware configured to implement the gate driver of FIGS. 1 and/or 2, and/or the comparator of FIGS. 1, 12, and/or 13 to control a power transistor.

A flowchart representative of an example process that may be carried out while utilizing example hardware logic, example machine readable instructions (e.g., hardware readable instructions), example hardware implemented state machines, and/or any combination thereof for implementing the gate driver 108 of FIG. 1, the gate driver 202 of FIG. 2, the comparator 110 of FIG. 1, the comparator circuit 1200 of FIG. 12, and/or the comparator circuit 1300 of FIG. 13 is shown in FIG. 20. The example machine readable instructions may be one or more executable programs or portion(s) of an executable program for execution by programmable processor(s), programmable controller(s), GPU(s), DSP(s), ASIC(s), PLD(s), and/or FPLD(s). The program may be embodied in software stored on a non-transitory computer readable storage medium such as a non-volatile memory, volatile memory, etc., but the entire program and/or parts thereof could alternatively be executed by any other device (e.g., programmable device) and/or embodied in firmware or dedicated hardware. Further, although the example program is described with reference to the flowchart illustrated in FIG. 20, many other methods of implementing the gate driver 108 of FIG. 1, the gate driver 202 of FIG. 2, the comparator 110 of FIG. 1, the comparator circuit 1200 of FIG. 12, and/or the comparator circuit 1300 of FIG. 13 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example process of FIG. 20 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

FIG. 20 is a flowchart representative of an example process 2000 that may be carried out while utilizing machine readable instructions that can be executed and/or hardware configured to implement the gate driver 108 of FIG. 1, the gate driver 202 of FIG. 2, the comparator 110 of FIG. 1, the comparator circuit 1200 of FIG. 12, and/or the comparator circuit 1300 of FIG. 13 to control a power transistor, such as $Q_S$ 148 of FIG. 1. The example process 2000 of FIG. 20 begins at block 2002, at which the gate driver 108 and/or the gate driver 202 turn on a power transistor, such as $Q_S$ 148 of FIG. 1, to generate a signal voltage, such as $V_{SHUNT}$ of FIG. 1.

At block 2004, the comparator 110, 1200, 1300 compares the signal voltage to a reference voltage at input transistors in a first differential stage to generate first amplified signals. For example, the input transistors $Q_1$ 1312, $Q_2$ 1314 of the first differential stage 1302 of the comparator 1300 of FIG. 13 can compare $V_{SIG}$ to $V_{REF}$ to generate PRE_P and PRE_N.

At block 2006, the comparator 110, 1200, 1300 generates second amplified signals in a second differential stage. For example, input transistors of the second differential stage 1304, $Q_3$ 1344 and $Q_4$ 1346, of the comparator 1300 of FIG. 13 can compare PRE_N and PRE_P to generate DIFF_P and DIFF_N.

At block 2008, the comparator 110, 1200, 1300 invokes a cross-coupled latch to generate a voltage based on the second amplified signals. For example, the second differential stage 1304 can invoke the cross-coupled latch 1306 of the comparator 1300 of FIG. 13 to generate $V_{GS,10}$.

At block 2010, the comparator 110, 1200, 1300 generates a comparator output based on the generated voltage. For example, the output stage 1308 of the comparator 1300 of FIG. 13 can generate an output signal at the output terminal 1372, which can correspond to a logic low signal, a logic high signal, etc., based on $V_{GS,10}$.

At block 2012, the comparator 110, 1200, 1300 determines whether the output signal is indicative of drain current of the power transistor satisfying a threshold. For example, in response to $V_{GS,10}$ being greater than $V_{TH}$ of $Q_{10}$ 1362, the comparator output at the output terminal 1372 can be $V_{DD}$ 1332. In such examples, $V_{DD}$ 1332 at the output terminal 1372 can be representative of $V_{SHUNT}$, which is generated based on the drain current of $Q_S$ 148 of FIG. 1, being greater than $V_{REF}$.

If, at block 2012, the comparator 110, 1200, 1300 determines that the output signal is not indicative of drain current of the power transistor satisfying a threshold, control returns to block 2004 to compare the signal voltage to the reference voltage at the input transistors in the first differential stage to generate the first amplified signals. If, at block 2012, the comparator 110, 1200, 1300 determines that the output signal is indicative of drain current of the power transistor satisfying a threshold, then, at block 2014, the gate driver 108 and/or the gate driver 202 turn off the power transistor to execute an auto-zero operation to reduce comparator offset. For example, in response to the gate driver 108 turning off $Q_S$ 148, the first control signal 1220 of FIG. 12 can be de-asserted and the second control signal 1222 of FIG. 12 can be asserted to configure the differential stages of the comparator circuit 1200 in unity-gain configuration.

At block 2016, the comparator 110, 1200, 1300 determines whether to continue controlling the power transistor. If, at block 2016, the gate driver 108 and/or the gate driver 202 determine to continue controlling the power transistor, control returns to block 2002 to turn on the power transistor to generate a signal voltage, otherwise the example process 2000 of FIG. 20 concludes.

From the foregoing, it will be appreciated that example gate driver circuits, auto-zero comparators, and related methods have been disclosed that improve operation of power delivery systems and other types of electrical systems. The example gate driver circuits and related methods disclosed herein do not need an additional voltage terminal greater than VDD to effectuate gate driver operations. The example gate driver circuits and related methods use fewer bootstrap stages and use additional pull-up transistors, which lead to improved efficiency of switching behavior, as the bootstrapped signal drives a portion of an output stage associated with a power transistor rather than the full output stage.

The example auto-zero comparators and related methods disclosed herein are implemented in GaN using resistors, capacitors, and N-type enhancement mode devices, with no depletion mode devices used. The example auto-zero comparators and related methods disclosed herein support rail-to-rail DC input common mode and, in some examples, up to capacitor breakdown voltage. The example auto-zero comparators and related methods disclosed herein reduce offset caused by immature matching.

Example methods, apparatus, systems, and articles of manufacture for gate driver circuits and/or auto-zero comparators are disclosed herein. Further examples and combinations thereof include the following:

Example 1 includes an integrated circuit comprising a transistor comprising a gate terminal and a current terminal, a gallium nitride (GaN) gate driver coupled to the gate terminal, the GaN gate driver configured to adjust operation of the transistor, and an enhancement mode GaN comparator coupled to at least one of the transistor the GaN gate driver, the enhancement mode GaN comparator configured to compare a voltage to a reference voltage, the voltage based on current from the current terminal, the GaN gate driver configured to adjust the operation of the transistor based on the comparison.

Example 2 includes the integrated circuit of example 1, wherein the transistor is a power transistor, the gate terminal is a power transistor gate terminal, the current terminal is a power transistor current terminal, and the GaN gate driver includes a first transistor comprising a first gate terminal and a first current terminal, a second transistor comprising a second gate terminal, a second current terminal, and a third current terminal, a third transistor comprising a third gate terminal, a fourth current terminal, and a fifth current terminal, a first rail-to-rail driver comprising a first input, a second input, a first output, a first enable output, and a second enable output, the first enable output coupled to the second gate terminal, the second enable output coupled to the third gate terminal, a second rail-to-rail driver comprising a third input, a fourth input, a second output, and a third enable output, the first input coupled to the first output, the second output coupled to the second input, the third enable output coupled to the first gate terminal, and a latch comprising a first latch output and a second latch output, the first latch output coupled to the first input, the second latch output coupled to the fourth input.

Example 3 includes the integrated circuit of example 1, wherein the transistor is a power transistor, the gate terminal is a power transistor gate terminal, the current terminal is a power transistor current terminal, and the GaN gate driver includes a NAND logic gate comprising a NAND output, a first inverter comprising a first inverter input and a first inverter output, the first inverter input coupled to the NAND output, a first transistor comprising a first gate terminal and a first current terminal, the first gate terminal coupled to the first inverter output, a second transistor comprising a second gate terminal and a second current terminal, the second gate terminal coupled to the NAND output, the second current terminal coupled to the first current terminal, a third transistor comprising a third gate terminal and a third current terminal, the third gate terminal coupled to the NAND output, a second inverter comprising a second inverter input and a second inverter output, a fourth transistor comprising a fourth gate terminal and a fourth current terminal, the fourth gate terminal coupled to the second inverter output, the fourth current terminal coupled to the third current terminal, a fifth transistor comprising a fifth gate terminal and a fifth current terminal, the fifth gate terminal coupled to third current terminal and the fourth current terminal, a sixth transistor comprising a sixth gate terminal and a sixth current terminal, the sixth gate terminal coupled to the NAND output, the sixth current terminal coupled to the fifth current terminal, and a seventh transistor comprising a seventh current terminal coupled to the fourth transistor.

Example 4 includes the integrated circuit of example 3, wherein the first through seventh transistors are N-type enhancement mode GaN transistors.

Example 5 includes the integrated circuit of example 1, wherein the transistor is a power transistor, and the enhancement mode GaN comparator has a first comparator input, a second comparator input, a comparator output, a first differential output, a second differential output, a first bootstrapped switch circuit coupled to the first differential output, and a second bootstrapped switch circuit coupled to the second differential output.

Example 6 includes the integrated circuit of example 5, wherein the transistor is a power transistor, and at least one of the first bootstrapped switch circuit or the second bootstrapped switch circuit includes a charge pump including a first transistor, a second transistor coupled to the first transistor, a first capacitor coupled to the first transistor and the second transistor, a second capacitor coupled to the first capacitor, the first transistor, and the second transistor, a first inverter coupled to the first capacitor, and a second inverter coupled to the first inverter, the first capacitor, and the second capacitor, and a bootstrapping circuit coupled to the charge pump.

Example 7 includes the integrated circuit of example 5, wherein the transistor is a power transistor, and at least one of the first bootstrapped switch circuit or the second bootstrapped switch circuit includes a charge pump, and a bootstrapping circuit coupled to the charge pump, the bootstrapping circuit including a first transistor coupled to the charge pump, a first capacitor coupled to the first transistor, a second transistor coupled to the charge pump and the first capacitor, a resistor coupled to the charge pump, a third transistor coupled to the resistor and the second transistor, a fourth transistor coupled to the third transistor and the resistor, a fifth transistor coupled to the fourth transistor, the second transistor, and the charge pump, a sixth transistor coupled to the fourth transistor and the fifth transistor, and a seventh transistor coupled to the fourth transistor, the fifth transistor, the sixth transistor, and at least one of the first comparator input or the second comparator input.

Example 8 includes the integrated circuit of example 1, wherein the transistor is a power transistor, and the enhancement mode GaN comparator includes one or more differential stages, a cross-coupled latch, and an output stage, a first differential stage of the one or more differential stages including a first resistor and a second resistor, a first transistor coupled to the first resistor, a second transistor coupled to the second resistor and the first transistor, a first common mode loop including a first set of common mode transistors coupled to the first resistor and the first transistor, and a second common mode loop including a second set of common mode transistors coupled to the second resistor and the second transistor.

Example 9 includes the integrated circuit of example 1, wherein the transistor is a power transistor, and the enhancement mode GaN comparator includes a first differential stage, a second differential stage, a cross-coupled latch, and an output stage, the second differential stage including a first resistor and a second resistor, a first transistor coupled to the first resistor and the first differential stage, a second transistor coupled to the second resistor and the second differential stage, a third transistor coupled to the first transistor, the second transistor, and the cross-coupled latch, and a fourth transistor coupled to the first transistor, the second transistor, the third transistor, and the cross-coupled latch.

Example 10 includes the integrated circuit of example 1, wherein the transistor is a power transistor, and the enhancement mode GaN comparator includes one or more differential stages, a cross-coupled latch, and an output stage, the cross-coupled latch including a first transistor coupled to a first differential stage of the one or more differential stages, a second transistor coupled to the first transistor, a third transistor coupled to the first transistor and the second transistor, and a fourth transistor coupled to the third transistor, the first differential stage, and the output stage.

Example 11 includes a gate driver comprising a first switch comprising a first gate terminal and a first current terminal, a second switch comprising a second gate terminal, a second current terminal, and a third current terminal, a third switch comprising a third gate terminal, a fourth current terminal, and a fifth current terminal, at least one of the first switch, the second switch, or the third switch is an enhancement mode gallium nitride (GaN) transistor, a first pre-driver circuit comprising a first input, a second input, a first output, a first enable output, and a second enable output, the first enable output coupled to the second gate terminal, the second enable output coupled to the third gate terminal, and a second pre-driver circuit comprising a third input, a fourth input, a second output, and a third enable output, the first input coupled to the first output, the second output coupled to the second input, the third enable output coupled to the first gate terminal.

Example 12 includes the gate driver of example 11, wherein at least one of the first pre-driver circuit or the second pre-driver circuit includes a NAND logic gate comprising a NAND output, a first inverter comprising a first inverter input and a first inverter output, the first inverter input coupled to the NAND output, a first transistor comprising a first gate terminal and a first current terminal, the first gate terminal coupled to the first inverter output, a second transistor comprising a second gate terminal and a second current terminal, the second gate terminal coupled to the NAND output, the second current terminal coupled to the first current terminal, and a third transistor comprising a third gate terminal and a third current terminal, the third gate terminal coupled to the NAND output, at least one of the first transistor, the second transistor, or the third transistor is an enhancement mode GaN transistor.

Example 13 includes the gate driver of example 12, wherein the at least one of the first pre-driver circuit or the second pre-driver circuit includes a second inverter comprising a second inverter input and a second inverter output, a fourth transistor comprising a fourth gate terminal and a fourth current terminal, the fourth gate terminal coupled to the second inverter output, the fourth current terminal coupled to the third current terminal, a fifth transistor comprising a fifth gate terminal and a fifth current terminal, the fifth gate terminal coupled to third current terminal and the fourth current terminal, a sixth transistor comprising a sixth gate terminal and a sixth current terminal, the sixth gate terminal coupled to the NAND output, the sixth current terminal coupled to the fifth current terminal, and a seventh transistor comprising a seventh current terminal coupled to the fourth transistor.

Example 14 includes the gate driver of example 13, wherein the first through seventh transistors are N-type enhancement mode GaN transistors.

Example 15 includes a comparator circuit comprising a comparator comprising a first comparator input, a second comparator input, a first differential output, a second differential output, and a comparator output, a first capacitor coupled to the first comparator input, a second capacitor coupled to the second comparator input, a first bootstrapped switch circuit coupled to the first differential output, the first capacitor, and the first comparator input, a second bootstrapped switch circuit coupled to the second differential output, the second capacitor, and the second comparator input, a first enhancement mode gallium nitride (GaN) transistor coupled to the first capacitor, and a second enhancement mode GaN transistor coupled to the first enhancement mode GaN transistor, the first capacitor, and the second capacitor.

Example 16 includes the comparator circuit of example 15, wherein at least one of the first bootstrapped switch circuit or the second bootstrapped switch circuit includes a charge pump including a first transistor, a second transistor coupled to the first transistor, at least one of the first transistor or the second transistor is an enhancement mode GaN transistor, a third capacitor coupled to the first transistor and the second transistor, a fourth capacitor coupled to the third capacitor, the first transistor, and the second transistor, a first inverter coupled to the third capacitor, and a second inverter coupled to the first inverter, the third capacitor, and the fourth capacitor, and a bootstrapping circuit coupled to the charge pump.

Example 17 includes the comparator circuit of example 15, wherein at least one of the first bootstrapped switch circuit or the second bootstrapped switch circuit includes a charge pump, and a bootstrapping circuit coupled to the charge pump, the bootstrapping circuit including a first transistor coupled to the charge pump, a third capacitor coupled to the first transistor, a second transistor coupled to the charge pump and the third capacitor, a resistor coupled to the charge pump, a third transistor coupled to the resistor and the second transistor, a fourth transistor coupled to the third transistor and the resistor, a fifth transistor coupled to the fourth transistor, the second transistor, and the charge pump, a sixth transistor coupled to the fourth transistor and the fifth transistor, and a seventh transistor coupled to the fourth transistor, the fifth transistor, the sixth transistor, and at least one of the first comparator input or the second comparator input, the first through seventh transistors are enhancement mode GaN transistors.

Example 18 includes the comparator circuit of example 15, wherein the comparator includes a differential amplifier including one or more differential stages, a cross-coupled latch, and an output stage, a first differential stage of the one or more differential stages including a first resistor and a second resistor, a first transistor coupled to the first resistor, a second transistor coupled to the second resistor and the first transistor, a first common mode loop including a first set of common mode transistors coupled to the first resistor and the first transistor, and a second common mode loop including a second set of common mode transistors coupled to the second resistor and the second transistor, at least one of the first transistor, the second transistor, one or more of the first set of the common mode transistors, or one or more of the second set of the common mode transistors is an enhancement mode GaN transistor.

Example 19 includes the comparator circuit of example 15, wherein the comparator includes a differential amplifier including one or more differential stages, a cross-coupled latch, and an output stage, a first differential stage of the one or more differential stages including a first resistor and a second resistor, a first transistor coupled to the first resistor, a second transistor coupled to the second resistor, a third transistor coupled to the first transistor, the second transistor, and the cross-coupled latch, and a fourth transistor coupled to the first transistor, the second transistor, the third transistor, and the cross-coupled latch, at least one of the first transistor, the second transistor, the third transistor, or the fourth transistor is an enhancement mode GaN transistor.

Example 20 includes the comparator circuit of example 15, wherein the comparator includes a differential amplifier including one or more differential stages, a cross-coupled latch, and an output stage, the cross-coupled latch including a first transistor coupled to the differential amplifier, a second transistor coupled to the first transistor, a third transistor coupled to the first transistor and the second transistor, and a fourth transistor coupled to the third transistor, the differential amplifier, and the output stage, at least one of the first transistor, the second transistor, the third transistor, or the fourth transistor is an enhancement mode GaN transistor.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

The following claims are hereby incorporated into this Detailed Description by this reference, with each claim standing on its own as a separate embodiment of the present disclosure.

What is claimed is:

1. An integrated circuit comprising:
 a switching transistor having first and second switching current terminals and a switching control terminal;
 a gallium nitride (GaN) gate driver having a gate driver input and a gate driver output, the gate driver output coupled to the switching control terminal;
 a latch having a latch output, a first latch input, a second latch input, and a third latch input, the latch output coupled to the gate driver input; and
 an enhancement mode GaN comparator having first and second comparator inputs and a comparator output, the first comparator input coupled to a reference voltage source, the second comparator input coupled to a signal voltage terminal, and the comparator output coupled to the first latch input.

2. The integrated circuit of claim 1, wherein the latch is a first latch and the latch output is a first latch output, the GaN gate driver comprising:
 a first transistor comprising a first control terminal and a first current terminal;
 a second transistor comprising a second control terminal, a second current terminal, and a third current terminal;
 a third transistor comprising a third control terminal, a fourth current terminal, and a fifth current terminal;
 a first rail-to-rail driver comprising a first input, a second input, a first output, a first enable output, and a second enable output, the first enable output coupled to the second control terminal, the second enable output coupled to the third control terminal;
 a second rail-to-rail driver comprising a third input, a fourth input, a second output, and a third enable output, the third input coupled to the first output, the second output coupled to the second input, the third enable output coupled to the first control terminal; and
 a second latch having a second latch output and a third latch output, the second latch output coupled to the first input, the third latch output coupled to the fourth input.

3. The integrated circuit of claim 1, wherein the GaN gate driver includes:
 a NAND logic gate having first and second NAND inputs and a NAND output;

a first inverter comprising a first inverter input and a first inverter output, the first inverter input coupled to the NAND output;

a first transistor comprising a first control terminal and a first current terminal, the first control terminal coupled to the first inverter output;

a second transistor comprising a second control terminal and a second current terminal, the second control terminal coupled to the NAND output, the second current terminal coupled to the first current terminal;

a third transistor comprising a third control terminal and a third current terminal, the third control terminal coupled to the NAND output;

a second inverter comprising a second inverter input and a second inverter output;

a fourth transistor comprising a fourth control terminal and a fourth current terminal, the fourth control terminal coupled to the second inverter output, the fourth current terminal coupled to the third current terminal;

a fifth transistor comprising a fifth control terminal and a fifth current terminal, the fifth control terminal coupled to third current terminal and the fourth current terminal;

a sixth transistor comprising a sixth control terminal and a sixth current terminal, the sixth control terminal coupled to the NAND output, the sixth current terminal coupled to the fifth current terminal; and a seventh transistor comprising a seventh current terminal coupled to the fourth transistor.

4. The integrated circuit of claim 3, wherein the first through seventh transistors are N-type enhancement mode GaN transistors.

5. The integrated circuit of claim 1, wherein the enhancement mode GaN comparator also has a first differential output coupled to a first bootstrapped switch circuit, and a second differential output coupled to a second bootstrapped switch circuit.

6. The integrated circuit of claim 5, wherein the first bootstrapped switch circuit includes:

a charge pump having:
  a first transistor;
  a second transistor coupled to the first transistor;
  a first capacitor coupled to the first transistor and the second transistor;
  a second capacitor coupled to the first capacitor, the first transistor, and the second transistor;
  a first inverter coupled to the first capacitor; and
  a second inverter coupled to the first inverter, the first capacitor, and the second capacitor; and
a bootstrapping circuit coupled to the charge pump.

7. The integrated circuit of claim 5, wherein the first bootstrapped switch circuit includes:

a charge pump; and
a bootstrapping circuit coupled to the charge pump, the bootstrapping circuit including:
  a first transistor coupled to the charge pump;
  a first capacitor coupled to the first transistor;
  a second transistor coupled to the charge pump and the first capacitor;
  a resistor coupled to the charge pump;
  a third transistor coupled to the resistor and the second transistor;
  a fourth transistor coupled to the third transistor and the resistor;
  a fifth transistor coupled to the fourth transistor, the second transistor, and the charge pump;
  a sixth transistor coupled to the fourth transistor and the fifth transistor; and a seventh transistor coupled to the fourth transistor, the fifth transistor, the sixth transistor, and at least one of the first comparator input or the second comparator input.

8. The integrated circuit of claim 1, wherein the enhancement mode GaN comparator includes a differential stage, a cross-coupled latch, and an output stage, the first differential stage including:

a first resistor and a second resistor;
a first transistor coupled to the first resistor;
a second transistor coupled to the second resistor and the first transistor;
a first common mode loop including a first set of common mode transistors coupled to the first resistor and the first transistor; and
a second common mode loop including a second set of common mode transistors coupled to the second resistor and the second transistor.

9. The integrated circuit of claim 1, wherein the enhancement mode GaN comparator includes a first differential stage, a second differential stage, a cross-coupled latch, and an output stage, the second differential stage including:

a first resistor and a second resistor;
a first transistor coupled to the first resistor and the first differential stage;
a second transistor coupled to the second resistor and the output stage;
a third transistor coupled to the first transistor, the second transistor, and the cross-coupled latch; and
a fourth transistor coupled to the first transistor, the second transistor, the third transistor, and the cross-coupled latch.

10. The integrated circuit of claim 1, wherein the enhancement mode GaN comparator includes a differential stage, a cross-coupled latch, and an output stage, the cross-coupled latch including:

a first transistor coupled to the differential stage;
a second transistor coupled to the first transistor;
a third transistor coupled to the first transistor and the second transistor; and
a fourth transistor coupled to the third transistor, the differential stage, and the output stage.

11. The integrated circuit of claim 1, the second switching current terminal adapted to be coupled to a load.

12. The integrated circuit of claim 1, the signal voltage terminal providing a signal voltage responsive to a current at the first switching current terminal.

13. A circuit comprising:

a transistor configured to produce a shunt voltage at a current terminal;
a latch;
an enhancement mode gallium nitride (GaN) comparator configured to produce a first signal in response to determining that the shunt voltage is greater than a reference voltage to reset the latch, the latch configured to, in response to receiving the first signal, reset to produce a logic signal; and
a GaN gate driver configured to, in response to receiving the logic signal, turn off the transistor.

14. The circuit of claim 13, the transistor turning off causes inductor current to flow, the circuit further comprising:

a capacitor configured to store a switch voltage in response to the inductor current; and
an inverter configured to produce an inverted logic signal based on the switch voltage; and wherein the latch is configured to instruct the GaN gate driver to turn on the transistor in response to the inverted logic signal.

15. The circuit of claim 13, wherein the latch is a first latch, the GaN gate driver comprising:
   a first transistor comprising a first control terminal and a first current terminal;
   a second transistor comprising a second control terminal, a second current terminal, and a third current terminal;
   a third transistor comprising a third control terminal, a fourth current terminal, and a fifth current terminal;
   a first rail-to-rail driver comprising a first input, a second input, a first output, a first enable output, and a second enable output, the first enable output coupled to the second control terminal, the second enable output coupled to the third control terminal;
   a second rail-to-rail driver comprising a third input, a fourth input, a second output, and a third enable output, the third input coupled to the first output, the second output coupled to the second input, the third enable output coupled to the first control terminal; and
   a second latch comprising a second latch output and a third latch output, the second latch output coupled to the first input, the third latch output coupled to the fourth input.

16. The circuit of claim 13, the enhanced mode GaN comparator comprising:
   a differential stage;
   a cross-coupled latch; and
   an output stage.

17. A circuit comprising:
   an input stage;
   an output stage coupled to the input stage, the output stage comprising a load; and
   a gallium nitride (GaN) die coupled to the output stage, the GaN die comprising:
      a switching transistor having a first switching current terminal, a second switching current terminal, and a switching control terminal, the first switching current terminal coupled to the load;
      a gallium nitride (GaN) gate driver having a gate driver input and a gate driver output, the gate driver output coupled to the switching control terminal;
      a latch having a latch output, a first latch input, a second latch input, and a third latch input, the latch output coupled to the gate driver input; and
      an enhancement mode GaN comparator having a first comparator input, a second comparator input, and a comparator output, the first comparator input coupled to a reference voltage source, the second comparator input coupled to a signal voltage terminal, and the comparator output coupled to the first latch input.

18. The circuit of claim 17, the GaN die further comprising a blanking circuit coupled between the second switching current terminal and the second comparator input.

19. The circuit of claim 17, the GaN die further comprising:
   a logic gate having a first logic input, a second logic input, and a logic output, the logic output coupled to the second latch input;
   a timer circuit coupled between the switching control terminal and the second logic input; and
   an inverter having an inverter input and an inverter output, the inverter output coupled to the first logic input and the inverter input coupled to the first switching current terminal.

20. The circuit of claim 17, wherein the latch is a first latch and the latch output is a first latch output, the GaN die further comprising:
   a second latch having a second latch output, a fourth latch input, and a fifth latch input, the second latch output coupled to the third latch input; and
   a supply regulator having a regulator input, a first regulator output, and a second regulator output, the regulator input coupled to a supply voltage terminal, the first regulator output coupled to the fourth latch input, and the second regulator output coupled to the fifth latch input.

* * * * *